(12) United States Patent
Najafi et al.

(10) Patent No.: US 11,275,563 B2
(45) Date of Patent: Mar. 15, 2022

(54) LOW-DISCREPANCY DETERMINISTIC BIT-STREAM PROCESSING USING SOBOL SEQUENCES

(71) Applicant: Regents of the University of Minnesota, Minneapolis, MN (US)

(72) Inventors: Mohammadhassan Najafi, Lafayette, LA (US); David J. Lilja, Lake Elmo, MN (US); Marcus Riedel, Shorewood, MN (US); Kiarash Bazargan, Plymouth, MN (US); Sayed Abdolrasoul Faraji, Minneapolis, MN (US); Bingzhe Li, Falcon Heights, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 146 days.

(21) Appl. No.: 16/906,122

(22) Filed: Jun. 19, 2020

(65) Prior Publication Data
US 2020/0401376 A1    Dec. 24, 2020

Related U.S. Application Data

(60) Provisional application No. 62/864,807, filed on Jun. 21, 2019, provisional application No. 62/864,798, filed on Jun. 21, 2019.

(51) Int. Cl.
*H03K 3/84* (2006.01)
*H03M 7/26* (2006.01)
(Continued)

(52) U.S. Cl.
CPC .............. *G06F 7/582* (2013.01); *G06F 7/70* (2013.01); *H03K 3/84* (2013.01); *H03M 7/26* (2013.01)

(58) Field of Classification Search
CPC ...... G06N 7/005; G06N 3/0472; G06F 7/582; G06F 7/70; H03M 7/26
See application file for complete search history.

(56) References Cited

U.S. PATENT DOCUMENTS 7,868,806 B2   1/2011 Seo et al.
10,063,255 B2   8/2018 Riedel et al.
(Continued)

OTHER PUBLICATIONS

Alaghi et al., "Fast and Accurate Computation using Stochastic Circuits," Design Automation and Test in Europe Conference and Exhibition, Mar. 24-28, 2014, IEEE online, Apr. 21, 2014, 4 pp.
(Continued)

*Primary Examiner* — Matthew D Sandifer
(74) *Attorney, Agent, or Firm* — Shumaker & Sieffert, P.A.

(57) ABSTRACT

Example devices are described that include a computational unit configured to process first set of data bits encoding a first numerical value and a second set of data bits encoding a second numerical value. The computational unit includes a bit-stream generator configured to generate bit combinations representing first and second bit sequences that encode the first and second numerical values, respectively, based on a proportion of the data bits in the sequence that are high relative to the total data bits. The first bit sequence is generated using a first Sobol sequence source, and the second bit sequence is generated using a second Sobol sequence source different from the first Sobol sequence source. The device also includes computation logic configured to perform a computational operation on the bit combinations and produce an output bit-stream having a set of data bits indicating a result of the computational operation.

27 Claims, 14 Drawing Sheets

(51) Int. Cl.
G06F 7/58 (2006.01)
G06F 7/70 (2006.01)

(56) References Cited

U.S. PATENT DOCUMENTS

| | | |
|---|---|---|
| 2017/0255225 A1 | 9/2017 | Lilja et al. |
| 2018/0204131 A1 | 7/2018 | Najafi et al. |
| 2019/0121839 A1 | 4/2019 | Mohajer et al. |
| 2019/0149166 A1 | 5/2019 | Mohajer et al. |
| 2019/0289345 A1 | 9/2019 | Najafi et al. |

OTHER PUBLICATIONS

Alaghi et al., "Stochastic Circuits for Real-Time Image-Processing Applications," Proceedings of the 50th Annual Design Automation Conference, May 29-Jun. 7, 2013, 6 pp.

Alaghi et al., "Survey of Stochastic Computing," ACM Transactions on Embedded Computing Systems, vol. 12, No. 2s, Article 92, May 2013, 19 pp.

Alaghi et al., "The Promise and Challenge of Stochastic Computing," IEEE Transactions on Computer-Aided Deign of Integrated Circuits and Systems, vol. 37, No. 8, Aug. 2018, pp. 1515-1531.

Dalal et al., "Low discrepancy sequences for Monte Carlo simulations on reconfigurable platforms," In 2008 International Conference on Application-Specific Systems, Architectures and Processors, Jul. 2008, pp. 108-113.

Gaines, "Stochastic Computing Systems," Advances in Information Systems Science, vol. 2, Chapter 2, 1969, 69 pp. (Applicant points out, in accordance with MPEP 609.04(a), that the year of publication, 1956, is sufficiently earlier than the effective U.S. filing date, so that the particular month of publication is not in issue.).

Jenson et al., "A Deterministic Approach to Stochastic Computation," submitted to the 2016 International Conference on Computer Aided Design, Jun. 10, 2016, 8 pp.

Najafi et al., "Time-Encoded Values for Highly Efficient Stochastic Circuits," IEEE Transactions on Very Large Scale Integration (VLSI) Systems, vol. 25, No. 5, May 2017, pp. 1644-1657.

Najafi et al., "A Reconfigurable Architecture with Sequential Logic-Based Stochastic Computing" ACM J. Emerging Technologies in Computing Systems, vol. 13, No. 4, Jun. 2017, 28 pp.

Najafi et al., "High Quality Down-Sampling for Deterministic Approaches to Stochastic Computing," IEEE Transactions on Emerging Topics in Computing, Dec. 2017, 7 pp.

Najafi et al., "Polysynchronous Clocking: Exploiting the Skew Tolerance of Stochastic Circuits," IEEE Transactions on Computers, vol. 66, No. 10, Oct. 2017, 13 pp.

Qian et al., "An Architecture for Fault-Tolerant Computation with Stochastic Logic," IEEE Transactions on Computers, vol. 60, Issue 1, Jan. 2011, 13 pp.

Brown et al., "Stochastic Neural Computation I: Computational Elements," IEEE Transactions on Computers, vol. 50, Issue 9, Sep. 2001, 15 pp.

Qian et al., "Synthesizing Logical Computation on Stochastic Bit Streams," ACM, Design Automation Conference, 2009 (Applicant points out, in accordance with MPEP 609.04(a), that the year of publication, 2009, is sufficiently earlier than the effective U.S. filing date, so that the particular month of publication is not in issue.) 8 pp.

Gupta et al., "Binary Multiplication with PN Sequences," IEEE Transactions on Acoustics, Speech, and Signal Processing, vol. 36, No. 4, Apr. 1988, pp. 603-606.

Qian, "Digital yet Deliberately Random: Synthesizing Logical Computation on Stochastic Bit Streams," Dissertation from the University of Minnesota, Jul. 2011, 185 pp.

Najafi et al., "An Overview of Time-Based Computing with Stochastic Constructs," Ultra-Low-Power Processors, IEEE Computer Society Micro, vol. 37, No. 6, Nov./Dec. 2017, pp. 62-71.

Liu et al., "Toward Energy-Efficient Stochastic Circuits Using Parallel Sobol Sequences," IEEE Transactions on Very Large Scale Integration (VLSI) Systems, vol. 26, No. 7, Jul. 2018, pp. 1326-1339.

Najafi et al., "Low-Cost Sorting Networks Using Unary Processing," IEEE Transactions on Very Large Scale Integration (VLSI) Systems, Aug. 2018, 10 pp.

Li et al., "Using Stochastic Computing to Reduce the Hardware Requirements for a Restricted Boltzmann Machine Classifier," FPGA '16: Proceedings of the International Symposium on Field Programmable Gate Arrays, Feb. 21-23, 2016, 6 pp.

Lee et al., "Energy-Efficient Hybrid Stochastic-Binary Neural Networks for Near-Sensor Computing," DATE '17: Proceedings of the Conference on Design, Automation & Test in Europe, Mar. 2017, 6 pp.

Najafi et al., "Deterministic Methods for Stochastic Computing using Low-Discrepancy Sequences," ICCAD '18: Proceedings of the International Conference on Computer-Aided Design, Nov. 5, 2018, Article No. 51, 8 pp.

Najafi et al., "Performing Stochastic Computation Deterministically," IEEE Transactions on Very Large Scale Integration (VLSI) Systems, vol. 27, No. 12, Dec. 2019, pp. 2925-2938.

Faraji et al., "Energy-Efficient Convolutional Neural Networks with Deterministic Bit-Stream Processing," 2019 Design, Automation, and Test in Europe Conference & Exhibition (DATE), Mar. 2019, 6 pp.

Najafi et al., "Fast-Converging, Scalable, Deterministic Bit-Stream Computing using Low-Discrepancy Sequences," The 27th International Workshop on Logic & Synthesis (IWLS) (Co-located with DAC'18), Jun. 2018, 6 pp.

Faraji et al., "Hybrid Binary-Unary Hardware Accelerator," IEEE, IEEE Transactions on Computers, vol. 69, No. 9, Sep. 1, 2020, 6 pp.

Najafi et al., "Accelerating Deterministic Bit-Stream Computing with Resolution Splitting," The 20th International Symposium on Quality Electronic Design (ISQED), Mar. 2019, 6 pp.

Najafi et al., "Using Resolution Splitting to Enhance Performance of Deterministic Bit-Stream Computing," The 27th International Workshop on Logic & Synthesis (IWLS) (Co-located with DAC'18), Jun. 2018, 7 pp.

Liu et al., "Energy Efficient Stochastic Computing with Sobol Sequences," In Design, Automation, and Test in Europe Conference Exhibition (DATE), Mar. 2017, pp. 650-653.

Niederreiter, "Random Number Generation and Quasi-Monte Carlo Methods," Society for Industrial and Applied Mathematics, Philadelphia, Pennsylvania, 1992, 243 pp. (Applicant points out, in accordance with MPEP 609.04(a), that the year of publication, 1992, is sufficiently earlier than the effective U.S. filing date, so that the particular month of publication is not in issue.).

| Design Approach | Area($\mu m^2$) | $2^{16}$ | $2^{15}$ | $2^{14}$ | $2^{13}$ | $2^{12}$ | $2^{11}$ | $2^{10}$ | $2^{9}$ | $2^{8}$ | $2^{7}$ | $2^{6}$ |
|---|---|---|---|---|---|---|---|---|---|---|---|---|
| Conventional SC - LFSR-32 | 1399 | 0.05 | 0.15 | 0.26 | 0.39 | 0.58 | 0.79 | 1.20 | 1.67 | 2.32 | 3.32 | 4.72 |
| Deter. Rel. Prime Length - Counter | 460 | 0.00 | 3.03 | 4.70 | 6.01 | 7.08 | 7.62 | 7.90 | 7.98 | 8.11 | 33.2 | 51.5 |
| Deter. Rotation - Counter | 617 | 0.00 | 3.10 | 4.84 | 6.15 | 7.08 | 7.66 | 7.99 | 8.17 | 8.26 | 33.1 | 51.8 |
| Deter. Clock Division - Counter | 460 | 0.00 | 12.3 | 18.7 | 21.8 | 23.4 | 24.0 | 24.4 | 24.5 | 24.9 | 49.6 | 62.2 |
| Deter. Rel. Prime Length - LFSR | 481 | ~0.00 | 0.09 | 0.16 | 0.24 | 0.34 | 0.47 | 0.60 | 0.72 | 0.85 | 2.56 | 4.22 |
| Deter. Rotation - LFSR | 637 | 0.00 | 0.09 | 0.16 | 0.24 | 0.35 | 0.47 | 0.60 | 0.71 | 0.82 | 2.56 | 4.26 |
| Deter. Clock Division - LFSR | 481 | 0.00 | 1.44 | 2.48 | 3.74 | 5.28 | 7.18 | 9.91 | 14.2 | 24.8 | 25.0 | 25.8 |
| Deter. First LD | 3361 | 0.00 | 0.0003 | 0.0013 | 0.0033 | 0.009 | 0.019 | 0.041 | 0.092 | 0.190 | 0.451 | 0.921 |
| Deter. Second LD | 1277 | 0.00 | 0.0013 | 0.0033 | 0.0075 | 0.014 | 0.031 | 0.059 | 0.112 | 0.190 | 0.451 | 0.921 |

FIG. 8A

| Design Approach | N=4, i=2 | N=4, i=3 | N=4, i=4 | N=8, i=2 | N=8, i=3 | N=8, i=4 | Stream Generator Structure |
|---|---|---|---|---|---|---|---|
| Binary radix | 165 | 512 | 993 | 688 | 2104 | 4945 | - |
| Conventional SC - LFSR | 697 | 1496 | 2632 | 1399 | 2974 | 5166 | 1+1*2*N-bit LFSRs + 1 N-bit Comp |
| Deter. Rel Prime - Counter | 212 | 318 | 424 | 460 | 690 | 920 | 1 N-bit Counter + 1 N-bit Comp |
| Deter. Rotation - Counter | 287 | 467 | 648 | 617 | 1003 | 1390 | 1 N-bit Counter + i-1 N-bit CounterEN + 1 N-bit Comp |
| Deter. Clock Div - Counter | 212 | 318 | 424 | 460 | 690 | 920 | 1 N-bit Counter + i-1 N-bit Comp |
| Deter. Rel. Prime - LFSR | 226 | 339 | 452 | 481 | 721 | 961 | 1 N-bit LFSR + 1 N-bit Comp |
| Deter. Rotation - LFSR | 301 | 489 | 676 | 637 | 1034 | 1431 | 1 N-bit LFSR + i-1 N-bit LFSREN + 1 N-bit Comp |
| Deter. Clock Div - LFSR | 226 | 339 | 452 | 481 | 721 | 961 | 1 N-bit LFSR + 1 N-bit Comp |
| Deter. First LD | 1005 | 3740 | 9127 | 3361 | 13193 | 32406 | 1 1*N-bit Counter + 1*1*N-bit Sobol Gen+ 1 N-bit Comp |
| Deter. First LD - 4x Parallel | 1388 | 4456 | 10259 | 4119 | 14714 | 35090 | 1 1*N-bit Counter + i-1 1*N-bit 4x-Par. Sobol Gen {16}+ 1*4 N-bit Comp |
| Deter. Second LD | 456 | 806 | 1156 | 1277 | 2324 | 3371 | i-1 N-bit Counter+i-1 N-bit (CounterEN+SobolGen)+1 N-bit Comp |

FIG. 8B

| Design Approach | Area ($\mu m^2$) | Target Error (MAE) | | | | | | | | | | | | | | |
|---|---|---|---|---|---|---|---|---|---|---|---|---|---|---|---|---|
| | | 0% | | 0.01% | | 0.1% | | 0.3% | | 0.5% | | 1.0% | | 2.0% | | 3.0% | |
| | | Cycle | A×D | Cycle | A×D | Cycle | A×D | Cycle | A×D | Cycle | A×D | Cycle | A×D | Cycle | A×D | Cycle | A×D |
| Conventional SC 8 | 700 | 65,280 | 44,351 | - | - | - | - | - | - | - | - | - | - | - | - | - | - |
| Conventional SC 16 | 1000 | - | - | - | - | 51,081 | 51,101 | 10,721 | 10,725 | 4,021 | 4,023 | 1,216 | 1,216 | 166 | 116 | 100 | 70 |
| Deter. Rel Prime-Counter | 679 | 65,536 | 44,334 | 65,255 | 44,334 | 64,430 | 43,774 | 62,640 | 42,558 | 60,960 | 41,416 | 56,730 | 38,542 | 48,550 | 32,985 | 40,805 | 27,723 |
| Deter. Rotation-Counter | 711 | 65,536 | 46,616 | 65,514 | 46,608 | 64,672 | 46,001 | 62,860 | 44,712 | 61,102 | 43,462 | 56,890 | 40,466 | 48,650 | 34,605 | 40,274 | 28,647 |
| Deter. Clk Div-Counter | 679 | 65,536 | 44,525 | 65,511 | 44,508 | 65,091 | 44,223 | 64,091 | 43,543 | 63,091 | 42,864 | 60,566 | 41,149 | 55,506 | 37,771 | 50,511 | 34,317 |
| Deter. Rel Prime-LFSR | 700 | 65,280 | 45,709 | 64,225 | 44,970 | 27,800 | 19,466 | 4,540 | 3,179 | 1,685 | 1,180 | 445 | 312 | 165 | 116 | 100 | 70 |
| Deter. Rotation-LFSR | 755 | 65,536 | 49,512 | 64,626 | 48,825 | 27,866 | 21,053 | 4,746 | 3,586 | 1,661 | 1,255 | 446 | 337 | 161 | 122 | 96 | 73 |
| Deter. Clk Div-LFSR | 700 | 65,536 | 45,888 | 65,471 | 45,843 | 64,101 | 44,884 | 56,126 | 39,299 | 46,226 | 32,367 | 24,626 | 17,243 | 8,206 | 5,746 | 3,691 | 2,584 |
| Deter. First LD | 3581 | 65,536 | 234,678 | 8,188 | 29,320 | 1,008 | 3,610 | 388 | 1,318 | 192 | 688 | 92 | 329 | 40 | 143 | 28 | 100 |
| Deter. First LD 4x Parallel | 3581 | 16,384 | 93,898 | 2,048 | 11,487 | 252 | 1,413 | 92 | 516 | 48 | 269 | 24 | 135 | 10 | 56 | 8 | 45 |
| Deter. Second LD | 1496 | 65,536 | 98,062 | 14,384 | 21,523 | 1,272 | 1,903 | 382 | 572 | 192 | 287 | 92 | 138 | 40 | 60 | 28 | 42 |

FIG. 8C

LOW-DISCREPANCY DETERMINISTIC BIT-STREAM PROCESSING USING SOBOL SEQUENCES

This application claims the benefit of U.S. Provisional Patent Application No. 62/864,807 (filed Jun. 21, 2019) and U.S. Provisional Patent Application Ser. No. 62/864,798 (filed Jun. 21, 2019), the entire content of each application being incorporated herein by reference.

GOVERNMENT INTEREST

This invention was made with government support under CCF-1438286 awarded by the National Science Foundation. The government has certain rights in the invention.

TECHNICAL FIELD

This patent application relates to electronic circuits and, in particular, performing arithmetic operations and complex mathematical functions in electronic circuits.

BACKGROUND

Stochastic computing (SC) is a low-cost noise-tolerant computing paradigm. In many stochastic computing systems, logical computation is performed on probability data in the [0, 1] interval. In some SC systems, the data is represented by bit-streams (e.g. uniformly distributed (random) bit-streams or pseudorandom bit-streams). In conventional SC systems, the ratio of the number of ones to the length of a given data unit (e.g., word) in the bitstream determines the value of the data unit. For example, a data unit of 1101011100 in the bitstream may be used as a representation of 0.6 in the stochastic domain.

SUMMARY

This disclosure describes fast-converging, scalable deterministic approaches to stochastic computing operating on bit-streams using low-discrepancy Sobel sequences generated according to the techniques described herein. In some implementations, these approaches may be completely accurate when running the operations for a required number of cycles. In other examples, the computation can be truncated early if some imprecision is acceptable. The proposed approaches significantly improve both the processing time and the area-delay product compared to other deterministic bit-stream approaches used with stochastic computing, where the area-delay product represents the processing time multiplied by the chip space taken up by the computational unit.

In some examples, a device includes an integrated circuit comprising a computational unit configured to process at least a first set of data bits encoding a first numerical value and a second set of data bits encoding a second numerical value. The computational unit includes a bit-stream generator configured to generate bit combinations representing a first bit sequence and a second bit sequence that encode the first and second numerical values, respectively, based on a proportion of the data bits in the sequence that are high relative to the total data bits in the sequence. A subset of the bit combinations pairs a data bit of the first bit sequence with multiple different data bits of the second bit sequence, wherein the first bit sequence is generated using a first Sobol sequence source, and wherein the second bit sequence is generated using a second Sobol sequence source different from the first Sobol sequence source. The computational unit also includes computation logic configured to perform a computational operation on the bit combinations and produce an output bit-stream having a set of data bits indicating a result of the computational operation, wherein the data bits of the output bit-stream represent the result based on a probability that any data bit in the set of data bits of the output bit-stream is high.

In some examples, a device is configured to process a first set of data bits encoding a first numerical value and a second set of data bits encoding a second numerical value. The device includes a counter configured to generate an output and a first Sobol sequence source configured to generate a first Sobol sequence based on the output of the counter. The device also includes a second Sobol sequence source configured to generate a second Sobol sequence based on the output of the counter, wherein the second Sobol sequence is different from the first Sobol sequence source, and wherein the first Sobol sequence source and the second Sobol sequence source are directly driven by the counter. The device further includes a first comparator configured to generate a first bit sequence based on the first Sobol sequence and a first constant number, and a second comparator configured to generate a second bit sequence based on the second Sobol sequence and a second constant number. The device includes computation logic configured to perform a computational operation on the first bit sequence and the second bit sequence and produce an output bit-stream having a set of data bits indicating a result of the computational operation, wherein the data bits of the output bit-stream represent the result based on a probability that any data bit in the set of data bits of the output bit-stream is high.

In some examples, a device is configured to process a first set of data bits encoding a first numerical value and a second set of data bits encoding a second numerical value. The device includes a first counter and a second counter configured to stall based on an output of the first counter. The device also includes a first Sobol sequence source configured to generate a first Sobol sequence based on the output of the counter. The device also includes a second Sobol sequence source configured to generate a second Sobol sequence based on the output of the counter, wherein the second Sobol sequence is different from the first Sobol sequence source. The device further includes a first comparator configured to generate a first bit sequence based on the first Sobol sequence and a first constant number and a second comparator configured to generate a second bit sequence based on the second Sobol sequence and a second constant number. The device includes computation logic configured to perform a computational operation on the first bit sequence and the second bit sequence and produce an output bit-stream having a set of data bits indicating a result of the computational operation, wherein the data bits of the output bit-stream represent the result based on a probability that any data bit in the set of data bits of the output bit-stream is high.

In some examples, a method includes receiving, at a bit stream generator, a first set of data bits encoding a first numerical value and a second set of data bits encoding a second numerical value. The method also includes generating, at the bit stream generator, bit combinations representing a first bit sequence and a second bit sequence that encode the first and second numerical values, respectively, based on a proportion of the data bits in the sequence that are high relative to the total data bits in the sequence. A subset of the bit combinations pairs a data bit of the first bit sequence with multiple different data bits of the second bit sequence, and generating the bit combinations comprises generating the first bit sequence using a first Sobol sequence source and generating the second bit sequence using a second Sobol sequence source different from the first Sobol sequence source. The method further includes producing, by computation logic, an output bit stream by performing a computational operation on the bit combinations, wherein the data bits of the output bit stream represent a result of the computational operation based on a probability that any data bit in the output bit stream is high.

In some examples, a stochastic computational unit includes a bit-stream generator configured to generate bit combinations representing a first bit sequence and a second bit sequence that encode first and second numerical values, respectively, based on a proportion of the data bits in the sequence that are high relative to the total data bits in the sequence, wherein a subset of the bit combinations pairs a data bit of the first bit sequence with multiple different data bits of the second bit sequence, wherein the first bit sequence is generated using a first Sobol sequence source, wherein the second bit sequence is generated using a second Sobol sequence source different from the first Sobol sequence source. The stochastic computational unit also includes stochastic processing circuitry configured to perform a computational operation on the bit combinations and produce an output bit-stream having a set of data bits indicating a result of the computational operation, wherein the data bits of the output bit-stream represent the result based on a probability that any data bit in the set of data bits of the output bit-stream is high.

The details of one or more aspects of the disclosure are set forth in the accompanying drawings and the description below. Other features, objects, and advantages of the techniques described in this disclosure will be apparent from the description, drawings, and claims.

BRIEF DESCRIPTION OF DRAWINGS

FIGS. 8A-8C are tables of the error and area of alternative design approaches.

DETAILED DESCRIPTION

Figure 1:
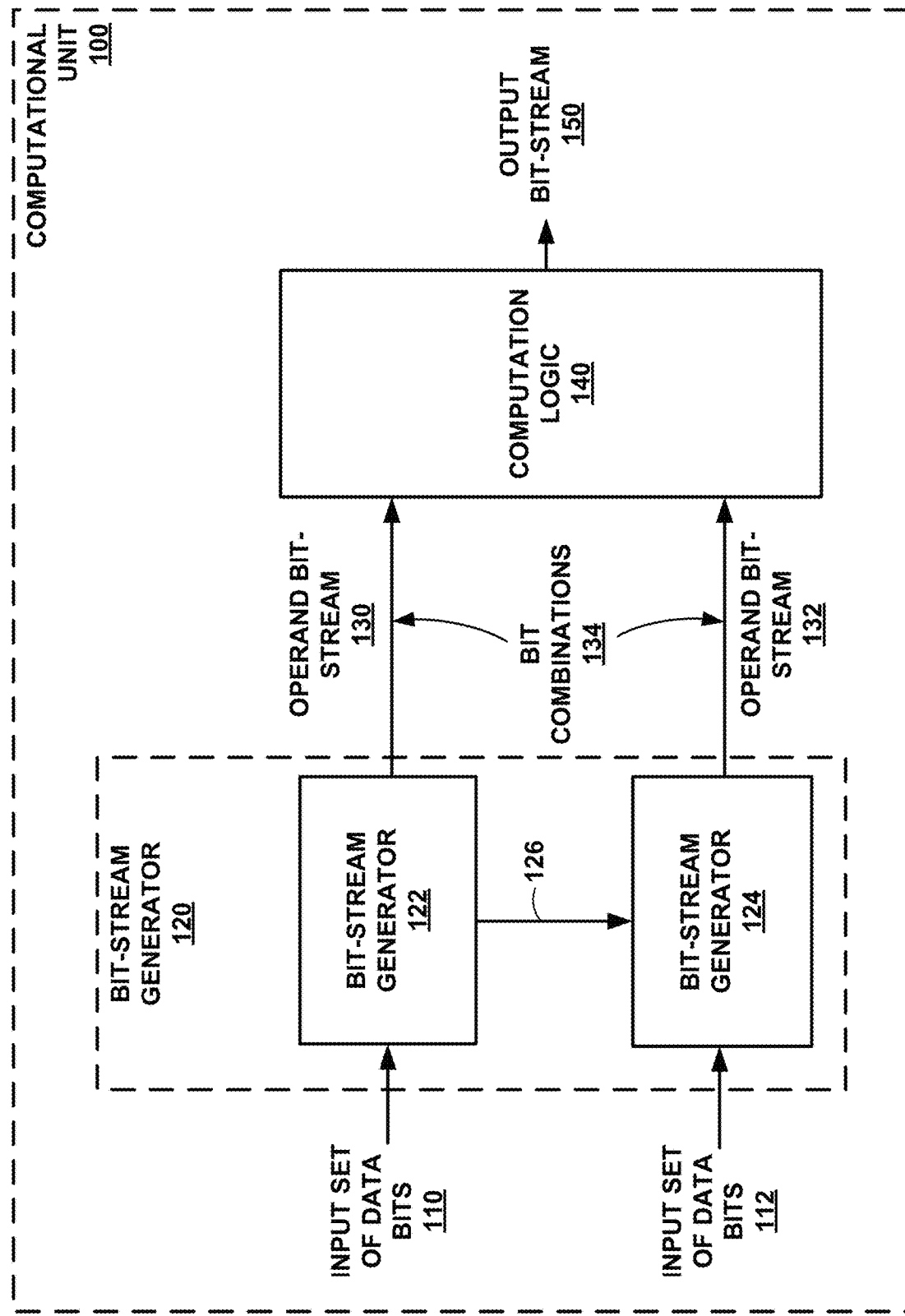
FIG. 1 is a conceptual block diagram of a computational unit configured to perform a computational operation on operand bit-streams, in accordance with some examples of this disclosure.

This disclosure describes techniques for generating bit-streams using Sobol sequences as bit streams for use within stochastic computational systems. For example, as described herein, a bit-stream generator may be used within a computational system to generate bit streams using Sobol sequences. The bit stream generator may, for example, produce a bit stream by comparing a binary number (e.g., an input value) to numbers in a Sobol sequence to generate a stream of bits that encodes a numerical value based on the proportion of bits in the bit-stream that are high. The numerical value encoded by the bit-stream matches the numerical value encoded by the binary number. As such, encoding of the bit stream may be well suited for use with computational logic, such as stochastic computational logic, configured to operate on bit streams having such encoding schemes.

In conventional systems, other deterministic and stochastic methods may slowly converge on an accurate result. This slow convergence makes deterministic approaches inefficient for applications that can tolerate some inaccuracy (e.g., image processing and neural network applications). Limited scalability is also a significant drawback of encoding data in pulse-width modulation signals and encoding data with some deterministic methods. The required number of cycles and the cost of generating bit-streams both increase significantly with an increasing number of inputs.

A "down-sampling" method described herein can improve the progressive precision of deterministic approaches. The down-sampling method may include substituting a full-resolution bit-stream with a shorter bit-stream with fewer bits that closely approximates the full-resolution bit-stream. The substitution may be accomplished by truncating or stopping the generation of the bit-stream before the full-resolution bit-stream has been produced. In other words, a numerical value can be represented with fewer bits, which may reduce the accuracy of the representation but may also reduce the latency or delay of the computation.

The down-sampling method includes modifying the structure of the stream generators by using pseudo-random stochastic bit-streams to speed up the convergence to the accurate result. When slight inaccuracy is acceptable, down-sampling provides a significant improvement in the processing time and the energy consumption. This disclosure describes architectures that allow for using shorter bit-streams and lower latencies while preserving accuracy and precision at a high level.

Furthermore, as described in this disclosure, using Sobol sequences to generate bit-streams for computation offers even better accuracy and lower error rates, especially for shorter run times, than other deterministic computational methods. As a result, using Sobol sequences for bit-stream computation allows for lower latency and lower total energy consumption, as compared to other deterministic computational methods. Moreover, bit-stream computation in general, and the use of Sobol sequence-based bit-streams in particular, is much more tolerant than binary computation to errors, such as bit flips.

FIG. 1 is a conceptual block diagram of a computational unit configured to perform a computational operation on operand bit-streams, in accordance with some examples of this disclosure. Computational unit 100 may be part of or include one or more integrated circuits, a sensor, an image or signal processor, a video processing circuitry, a camera, a mobile device, a digital chip, a machine learning device, or another suitable device. The techniques of this disclosure may be especially useful for approximate computing applications and applications that tolerate some degree of uncertainty, such as video processing, image tagging, and neural networks.

Input sets of data bits 110 and 112 encode numerical values (i.e., operands), and the encoding of input sets 110 and 112 may take the form of binary encoding, unary encoding, edge coding (e.g., one-hot or one-cold coding), and/or any other type of encoding. Bit-stream generator 120 receives input sets 110 and 112 as parallel data bits, serial data bits, and/or a combination of parallel and serial data bits. In some examples, bit-stream generator 120 receives a first number encoded in input set of data bits 110 for a first computational operation and receives a second number for a second computational operation. The second number can be encoded in a new iteration of input set of data bits 110 or in input set of data bits 112. Computation logic 140 performs one or more computation operations on operand bit-stream 130 encoding the first number and the operand bit-stream 132 encoding the second number.

Bit-stream generator 120 is configured to receive input sets of data bits 110 and 112 and generate operand bit-streams 130 and 132 in which the input values are converted into quasi-random bit-stream representations. In some examples, one or both of operand bit-streams 130 and 132 is a shifted, stalled, and/or rotated form of a bit-stream. For example, operand bit-stream 132 may be stalled periodically in order to rotate bit combinations 130 between operand bit-streams 132 and 134. Bit-stream generator 120 includes two or more bit-stream generators 122 and 124 that may generate operand bit-streams 130 and 132 as bit sequences to encode the numerical values from input sets of data bits 110 and 112.

Each of bit-stream generators 122 and 124 may encode a respective numerical value in an order of digits that is based on a Sobol sequence, where bit-stream generators 122 and 124 use different Sobol sequences to increase the accuracy of computational operations, as described with respect to FIG. 2 below. A different set of bits can be generated using a different Sobol sequence or both. Thus, each bit in the first bit sequence represented by operand bit-stream 130 is matched with bits in the second bit sequence so that the result of the computational operation approaches high accuracy more quickly than unary bit-stream-based processing can approach high accuracy.

Each of bit-stream generators 122 and 124 also receives a clock signal. Bit-stream generator 124 can receive control signal 126 as a clock signal, an inhibit signal, and/or a reset signal from bit-stream generator 122. In response to receiving a clock signal, bit-stream generator 124 iterates the number produced by the Sobol sequence source of bit-stream generator 124. In response to receiving an inhibit signal, bit-stream generator 124 stalls the number produced by the Sobol sequence source of bit-stream generator 124 so that the Sobol sequence source continues to produce the same number.

In some examples, the Sobol sequence sources of each of bit-stream generators 122 and 124 may implement a relatively prime method, clock division method, or rotation method to ensure that each bit of a first operand bit-stream is matched up with each bit of a second operand bit-stream. Additional example details of bit-stream generators and the relatively prime, clock division, and rotation methods can be found in commonly assigned U.S. Pat. No. 10,063,255, issued on Aug. 28, 2018, entitled "Stochastic Computation Using Deterministic Bit-streams," and U.S. patent application Ser. No. 16/352,933, which published as U.S. Patent Application Publication No. 2019/0289345, entitled "High Quality Down-Sampling for Deterministic Bit-Stream Computing," each of which is incorporated herein by reference in its entirety.

Operand bit-streams 130 and 132 may include a signal that is digital in value (e.g., 0 volts=low, 1 volt=high). For example, operand bit-streams 130 and 132 may include a string of zeroes and ones (e.g., low and high voltage levels) to encode a numerical value. For example, the value of 0.3 may be encoded in ten data bits as 1001000010 or 0110000100. In contrast, a unary bit-stream always encodes 0.3 in ten data bits as 1110000000 or 0000000111, where the three one's are moved to the beginning or end of the bit-stream and the seven zeroes are moved to the beginning or end of the bit-stream. Edge coding encodes 0.3 in ten data bits as 0000001000 for one-hot coding or 1111110111 for one-cold coding. Moreover, a stochastic bit-stream may encode 0.3 in a manner that may appear similar to operand bit-streams 130 and 132, but each data bit in the stochastic bit-stream is random. In contrast, the next bit in each of operand bit-streams 130 and 132 is based on the Sobol sequence source. The Sobol sequence source includes a direction vector array for generating each Sobol number, where the direction vector array produces a quasi-random number that is used to generate the Sobol number.

Computation logic 140 represents a functional component, e.g., a processing unit and/or a digital logic unit, designed to perform operations, such as arithmetic operations, image processing, video processing, signal processing, and the like. Computation logic 140 may include stochastic processing circuitry such one or more logic gates (e.g., AND gates, OR gates, XOR gates, etc.), transistors, resistors, capacitors, diodes, and/or any other suitable components. Computation logic 140 receives bit combinations 134 as parallel bits of operand bit-streams 130 and 132.

In some examples, computation logic 140 may include a scaling network and/or a shuffling network. Additional example details of scaling networks and shuffling networks can be found in commonly assigned U.S. Patent Application Publication No. 2019/0121839, filed on Oct. 19, 2018, entitled "Parallel Computing Using Stochastic Circuits and Deterministic Shuffling Networks," and U.S. Patent Application Publication No. 2019/0149166, filed on Nov. 9, 2018, entitled "Computational Devices Using Thermometer Coding and Scaling Networks on Unary Encoded Data," each of which is incorporated herein by reference in its entirety.

Output bit-stream 150 may encode the result of the computational operation performed by computation logic 140. For example, if the computational operation is a multiplication operation, the numerical value encoded by output bit-stream 150 may be equal to, or approximately equal to, the product of the numerical values encoded by input sets of data bits 110 and 112. If input set of data bits 110 encodes a numerical value of 0.5, input set of data bits 112 encodes a numerical value of 0.6, and computation logic 140 performs a multiplication operation, then output bit-stream 150 may encode a numerical value of 0.3 (0.5×0.6). Output bit-stream 150 may have a length that is less than $2^{2N}$ data bits, where numbers 168 and 182 (shown in FIG. 2) each have a length of N data bits, and operand bit-streams 130 and 132 have lengths of $2^N$ data bits.

Figure 2:
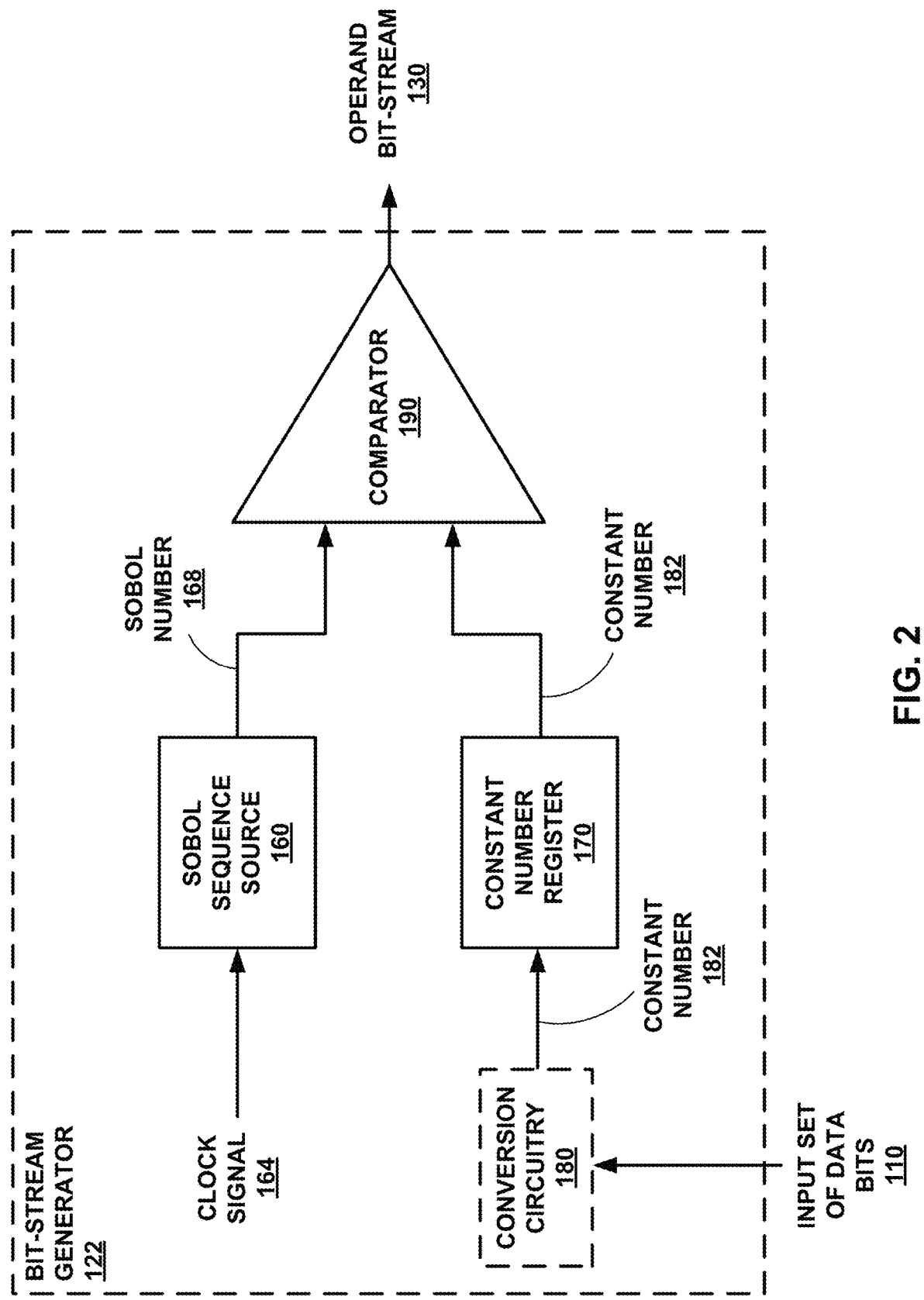
FIG. 2 is a conceptual block diagram of a bit-stream generator configured to generate an operand bit-stream based on comparing a Sobol sequence number and a constant number, in accordance with some examples of this disclosure.

FIG. 2 is a conceptual block diagram of a bit-stream generator configured to generate an operand bit-stream based on comparing a Sobol sequence number and a constant number, in accordance with some examples of this disclosure. The structure of bit-stream generator 124 of FIG. 2 may be similar to the structure of stream generator 122 shown in FIG. 1. However, bit-stream generator 122 receives clock signal 164, while bit-stream generator 124 receives control signal 126 in addition to or as a substitute for clock signal 164. Thus, bit combinations 134 include pairs of bits from operand bit-streams 130 and 132 that are scrambled or shuffled so that output bit-stream 150 converges on an accurate result more quickly than unary-stream-based deterministic methods of stochastic computing.

Sobol sequence source 160 may be configured to generate Sobol number 168 based on clock signal 164 and an optional inhibit signal or reset signal. Sobol sequence source 160 may include a direction vector array and logic circuitry that generates a Sobol number for each cycle of clock signal 164, unless an inhibit signal is active to prevent the Sobol sequence source 160 from generating a new value for Sobol number 168. Sobol sequence source 160 may include a counter that increments in response to each rising or falling edge of clock signal 164. When the counter increments, Sobol sequence source 160 may generate a new Sobol number.

In response to receiving an inhibit signal, Sobol sequence source 160 can stall the output of a counter that drives Sobol sequence source 160, such that Sobol sequence source 160 continues to generate the same Sobol number until the inhibit signal returns to an inactive state. In some examples, the inhibit signal has an active value for zero or one clock cycle each $2^N$ clock cycles. Each Sobol number may be based on the function or design of Sobol sequence source 160, which may be implemented through logic circuitry that receives one or more bits from Sobol number 168 to generate the new Sobol numbers. Sobol sequence source 160 may output a new iteration of N-bit Sobol number 168 to comparator 190 each clock cycle. Thus, over two or more clock cycles, Sobol sequence source 160 generates a series of Sobol numbers 168 for input to comparator 190.

Figure 7:
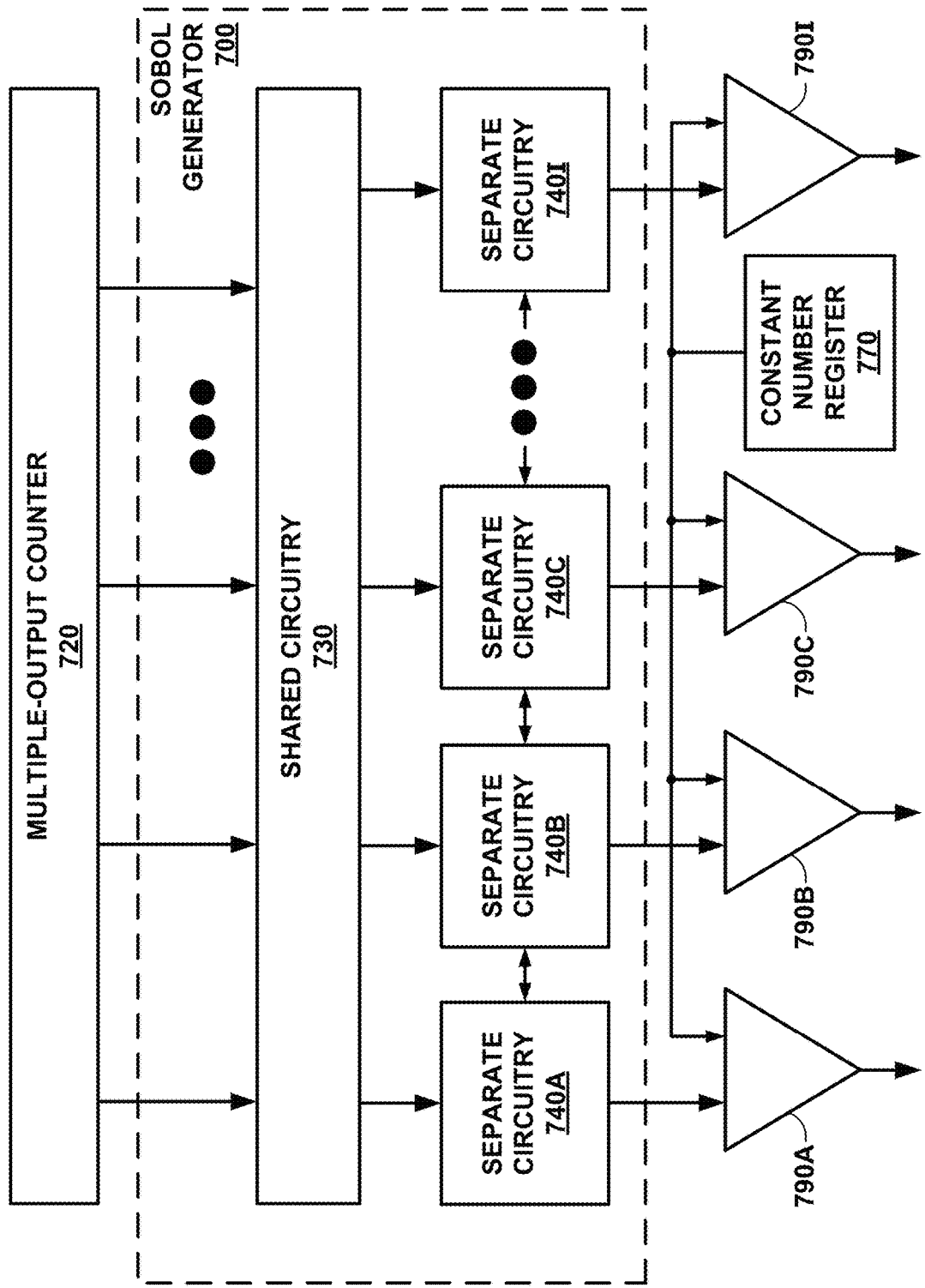
FIG. 7 is a conceptual block diagram of an example Sobol sequence generator configured to output multiple Sobol numbers in parallel, in accordance with some examples of this disclosure.

In some examples, Sobol sequence source 160 may include circuitry for generating more than one Sobol number in parallel for each clock cycle, as shown in FIG. 7. Sobol sequence source 160 may be configured to output M consecutive Sobol numbers in parallel to M comparators, where M is an integer. In a parallel implementation, each of the M comparators receives one of the Sobol numbers outputted by Sobol sequence source 160 and produces an operand bit-stream. A parallel implementation results in a slight increase in hardware and a large saving in latency.

A Sobol sequence is a quasi-random, low-discrepancy sequence of numbers. Each Sobol number may form a successively finer partition of an interval (e.g., a range between zero and one) by splitting the interval into half, then into fourths, then into eighths, etc. Thus, a Sobol sequence reduces the discrepancy between or across each sub-interval, as compared to a pure random number generator.

A Halton sequence is another example of a quasi-random, low-discrepancy sequence. A Halton sequence generator consists of a binary-coded base-b counter, where b is a prime number. For d independent input streams in a SC system, d counters with different prime bases can be used for a Halton sequence generator. For instance, a simple case of multiplying two stochastic bit-streams using an AND gate includes one base-2 and one base-3 counter. Stochastic bit-streams generated using Halton-based sequences can significantly improve the processing time of SC. However, the base conversion comes at the cost of significant additional hardware overhead.

Compared to generating Halton sequences, generating Sobol sequences does not require additional base-conversion hardware. The Sobol sequence generator, instead, can include an address generator that detects the position of the least significant zero, a storage array storing the values of the direction vectors, and a pair of XOR gate and D-type flip-flop for recursively generating random numbers. Different Sobol sequences can be generated by changing the values of the direction vectors.

A Halton-based stochastic multiplier takes about twice the sequence length to achieve a similar accuracy as the Sobol-based design. An n-bit Sobol generator, on the other hand, has a higher hardware footprint than an n-bit Halton generator. Both these designs consume a similar amount of energy if there is no parallelization. With parallelization, the processing time is significantly reduced: multiple Sobol numbers are generated in each cycle at the cost of some additional XOR gates.

One example of a low-discrepancy sequence can be generated by reversing the bits outputted by a counter. For example, the output bits of a four-bit counter can be reversed, creating the following bit-reversal low-discrepancy sequence: 1000, 0100, 1100, 0010, 1010, 0110, and so on.

Constant number register 170 may be configured to store constant number 182 for the duration of a computational operation. Constant number 182 can come directly from a sensor, rather than being stored in register 170. In some examples, constant number 182 and Sobol number 168 may be N-bit binary numbers, and comparator 190 may include an N-bit comparator. Constant number register 170 may be configured to store and deliver constant number 182 to a first input node of comparator 190 as Sobol sequence source 160 delivers Sobol numbers to a second input node of comparator 190. Input set of data bits 110 may include an N-bit binary number that is stored as constant number 182 in constant number register 170. Generator 160 and register 170 may have a length that is greater than or equal to N data bits in order to facilitate operation on the input number.

Conversion circuitry 180 is an optional component of bit-stream generator 122. Conversion circuitry 180 may be configured to convert input set of data bits 110 from a first format to a second format. For example, the first format and/or the second format may be one of the following encoding schemes: unary encoding, edge encoding, binary encoding, stochastic encoding, deterministic encoding, and/or any other suitable format.

Comparator 190 may be configured to generate operand bit-stream 130 based on the relative values of Sobol number 168 and constant number 182. In some examples, comparator 190 may generate a high value for operand bit-stream 130 if Sobol number 168 is less than or equal to constant number 182 and a low value if Sobol number 168 is greater than constant number 182. Comparator 190 may include an N-bit comparator configured to compare two N-bits numbers 168 and 182.

The use of Sobol sequence source 160, rather than a random number source, may result in much better accuracy than unary or stochastic operations for less than $2^{2N}$ cycles, where N is the length of numbers 168 and 182. Stochastic computation may have higher inaccuracies than using Sobol sequences due to random fluctuations. Due to random fluctuations, stochastic operations often need to run for a very long time to produce highly accurate results.

In some examples, each of bit-stream generators 120, 122, and 124, computation logic 140, and/or comparator 190 may include asynchronous local clocks or a global clock with relaxed clock arrival requirements. Additional example details of asynchronous clocking can be found in commonly assigned U.S. Patent Application Publication No. 2017/0255225, filed on Mar. 3, 2017, entitled "Polysynchronous Stochastic Circuits," which is incorporated herein by reference in its entirety.

Figure 3:
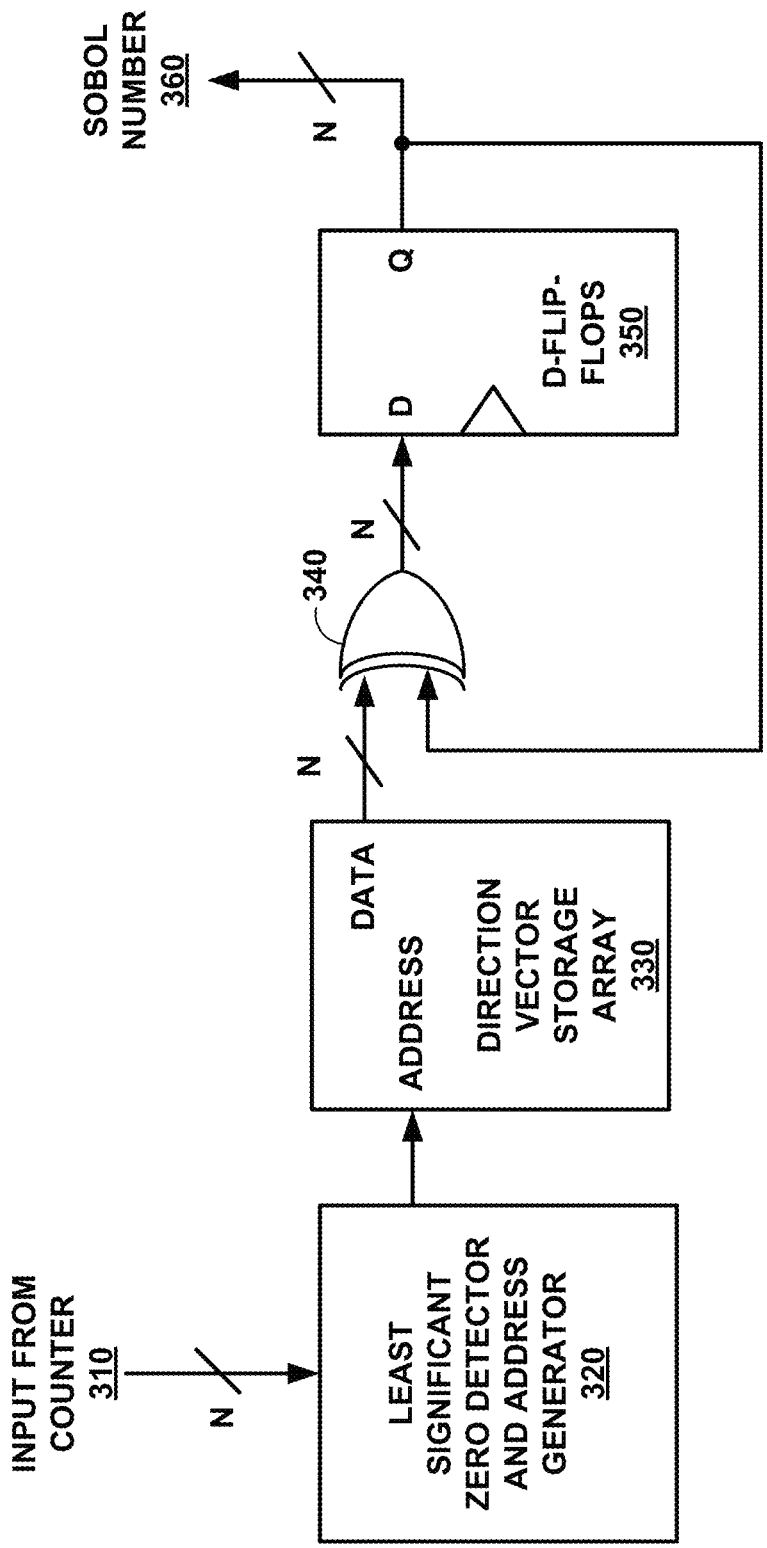
FIG. 3 is a conceptual block and circuit diagram of an example Sobol sequence generator, in accordance with some examples of this disclosure.

FIG. 3 is a conceptual block and circuit diagram of an example Sobol sequence generator, in accordance with some examples of this disclosure. The Sobol sequence generator shown in FIG. 3 is an example of Sobol sequence source 160 shown in FIG. 2. Least significant zero detector and address generator 320 receives input 310 from an N-bit counter. The least significant zeroes of continuous non-negative integers follow a regular pattern. The values stored in direction vector storage array 330 will determine the Sobol sequence that is outputted by the generator. In other words, different Sobol sequences can be generated by changing the values of the direction vectors.

Direction vector storage array 330 outputs an N-bit value to the N-bit XOR gate 340, which also receives the Q outputs of D flip-flops 350 as a second input. XOR gate 340 generates an output value (e.g., an N-bit output) based on the received inputs and delivers the output value to D flip-flops 350. Sobol number 360 is the Q outputs of D flip-flops 350 in the example shown in FIG. 3.

Low discrepancy (LD) sequences such as Sobol sequences and Halton sequences can be used to accelerate the convergence in Monte-Carlo simulations or to improve the speed of computation on stochastic bit-streams. With LD sequences, 1's and 0's in the stochastic streams are uniformly spaced, so the streams do not suffer from random fluctuations. The bit-streams can quickly and monotonically converge to the target value, producing acceptable results in a much shorter time.

A Halton sequence generator consists of a binary-coded base-b counter, where b is a prime number. For d independent input streams in a SC system, d counters with different prime bases can be used. For instance, in the simplest case of multiplying two stochastic bit-streams using an AND gate, one base-2 and one base-3 counter are used. Stochastic bit-streams generated using Halton-based sequences can significantly improve the processing time of SC. However, the base conversion comes at the cost of significant additional hardware overhead. Compared to generating Halton sequences, generating Sobol sequences does not involve additional base-conversion hardware.

A Halton-based stochastic multiplier takes about twice the sequence length to achieve a similar accuracy as the Sobol-based design. An N-bit Sobol generator, on the other hand, has a higher hardware footprint than an N-bit Halton generator. Both these designs consume a similar amount of energy if there is no parallelization. With parallelization as shown in FIG. 7, the processing time is significantly reduced: multiple Sobol numbers are generated in each cycle at the cost of some additional XOR gates.

Figure 4:
FIG. 4 is a table of the first sixteen numbers of four example Sobol sequences, along with the category of each number on the position in the [0,1] interval.

FIG. 4 is a table of the first sixteen numbers of four example Sobol sequences, along with the category of each number on the position in the [0,1] interval. As an example, two 2-bit precision input values can be multiplied by converting the first input value to a bit-stream representation using the simplest Sobol sequence (Sobol sequence 1 in FIG. 4). The second input value is converted using the second Sobol sequence in FIG. 4. When converting to a bit-stream representation, a one is generated if the Sobol number is less than the input target number.

| | | | | | |
|---|---|---|---|---|---|
| 1/4 | = | 1000 | 1000 | 1000 | 1000 |
| 3/4 | = | 1101 | 1110 | 0111 | 1011 |
| 3/16 | = | 1000 | 1000 | 0000 | 1000 |

The accurate output of multiplying the two 2-bit precision input values is obtained by directly converting the inputs to $2^4$-bit-streams, by comparing them to the first $2^4$ numbers of two Sobol sequences and ANDing the generated bit-streams. This method produces deterministic and accurate results because the first $2^n$ numbers of any Sobol sequence include all n-bit precision values in the [0, 1) interval. In addition, if equally split [0, 1) into $2^n$ sub-intervals, in any consecutive group of $2^n$ Sobol numbers starting at positions i×$2^n$ (i=0, 1, 2, . . . ), there is exactly one member in each sub-interval.

The table in FIG. 4 categorizes consecutive groups of $2^2$ numbers in the first four Sobol sequences, where each column has a separate four-bit Sobol number. Each Sobol number in each group is labeled with a number from 0 to 3 depending on its subinterval. For example, ⅛ in Sobol sequence 1 is labeled with $a_0$ because it is a member of the first sub-interval, [0, ¼). When converting a 2-bit precision input value into a $2^4$-bit-stream by comparing it to the first $2^4$ numbers of a Sobol sequence, the result is the same for the Sobol numbers with the same label. For example, comparing ¾ to ⅝ and ¹¹⁄₁₆ from the Sobol sequence 2 generates the same bit of '1' as both ⅝ and ¹¹⁄₁₆ are a member of [½, ¾) (label $b_2$) and so are both less than the input value of ¾.

As can be seen in the table shown in FIG. 4, any selected group of $2^2$ numbers includes all labels from 0 to 3, and as a result, all groups of the same Sobol sequence will produce the same number of 1s. All groups can accurately present the target input value and their difference will only be in the order of bits (order of labels).

Figure 5:
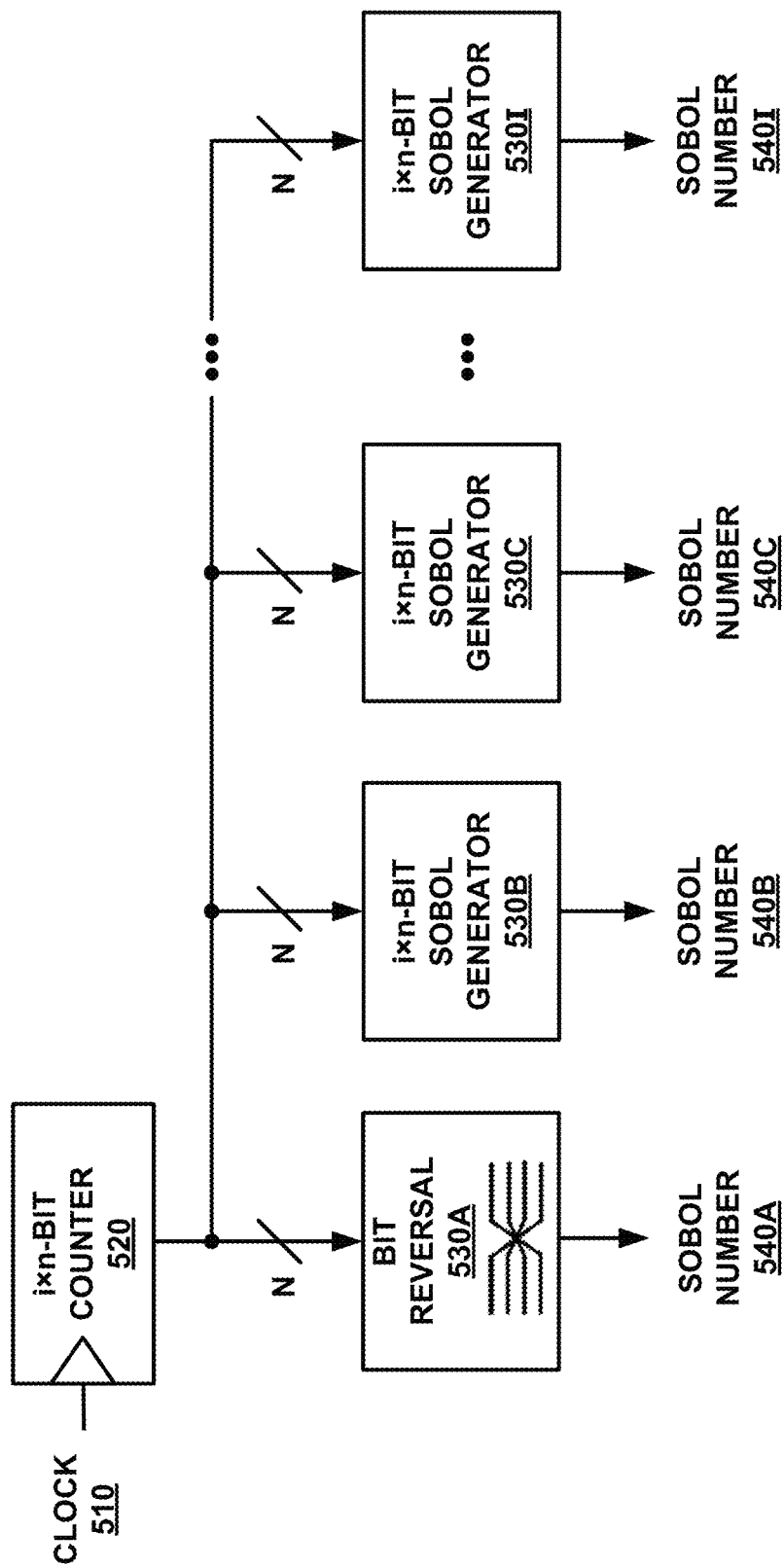
FIG. 5 is a conceptual block diagram of direct low-discrepancy Sobol sequence generators.

FIG. 5 is a conceptual block diagram of direct low-discrepancy Sobol sequence generators. Independence among Sobol-based bit-streams is achieved by using different Sobol sequences for generating the bit-streams and processing the streams for a specific number of cycles. The precision of the LD sequence generator should be i times the precision of the input data, where i is the number of independent bitstreams. Each input data is converted to a stream of $2^{i*n}$ bits by comparing the input value to $2^{i*n}$ different numbers from the sequence generator. For example, to multiply two n-bit precision input data, two 2n-bit precision Sobol sequence generators can be used.

Two input values can be multiplied deterministically and accurately by simply pairing every bit of one input stream with every bit of the other stream exactly once. As shown in FIG. 4 for n=2, for any pair of two different Sobol sequences, every label u (u=0, 1, 2, 3) in $x_u$ (x=a, b, c, d) meets every label t (t=0, 1, 2, 3) in $y_t$ (y=a, b, c, d) exactly once. So, the result of multiplying two 2-bit precision numbers by ANDing their $2^4$-bit-stream representation, generated based on two different Sobol sequences, is deterministic and completely accurate.

Multiplication of i n-bit precision numbers when converting the input numbers to bit-streams of $2^{i \cdot n}$-bit length by comparing them to $2^{i \cdot n}$ numbers from i different Sobol sequences. The generated bitstreams can be divided into groups of $2^n$ bits. Every bit (label) from a bit-stream interacts with every bit (label) of the other bit-streams exactly once, which results in a deterministic and accurate output bit-stream.

FIG. 5 shows the structure of the sources of generating Sobol sequences for a first LD-based method. These sources are used as the number sources in the converter module. The simplest Sobol sequence is simply the reverse of the output bits of a binary counter. Accordingly, the first Sobol sequence can be generated by hard-wiring the output bits of a counter at no extra hardware cost.

In the example arrangement shown in FIG. 5, counter 520 is configured to generate an N-bit value based on clock signal 510. Each of Sobol generators 530A-530I are configured to generate a respective one of Sobol numbers 540A-540I. Each of Sobol numbers 540A-540I may be fed into a respective comparator for comparison with a constant number. The respective comparator may be configured to generate a bit sequence, where a probability that any data bit in the bit sequence is high represents the numerical value encoded by the respective constant number.

Sobol number 540A, for example, may include i×n bits, compared to Sobol number 640A, which includes only n bits. Thus, the architecture shown in FIG. 6 may have a lower hardware cost than the architecture shown in FIG. 5.

Figure 6:
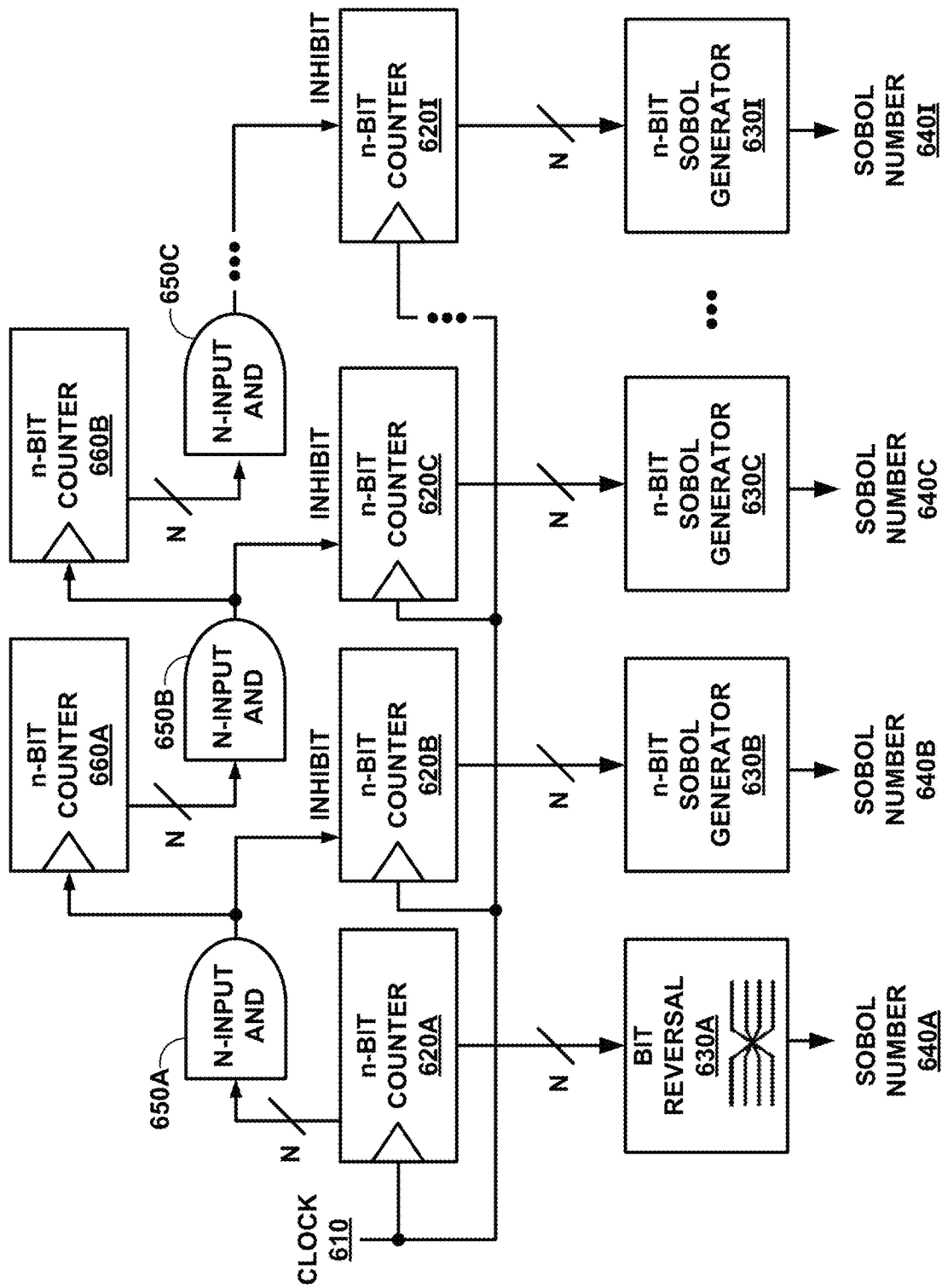
FIG. 6 is a conceptual block diagram of integrated low-discrepancy Sobol sequence generators.

FIG. 6 is a conceptual block diagram of integrated low-discrepancy Sobol sequence generators. Sobol generators 630A-630I are configured to generate Sobol numbers 640A-640I based on a dedicated counter for each of Sobol generators 630A-630I. In the example shown in FIG. 6, counter 620B is configured to stall every $2^N$ cycles when the output of counter 620A causes logic gate 650A to output an inhibit signal. In examples in which logic gates 650A-650C are AND gates, counters 620B-620I may be configured to stall no more than every $2^N$ clock cycles.

The precision of the sequence generator is equal to the precision of the input data (e.g., N bits in the example shown in FIG. 6). For example, for multiplication of two n-bit precision input data, two n-bit LD sequence generators are used to produce Sobol numbers. When using Halton sequences that are generated based on prime numbers, the "relatively prime" method must be used. The Sobol sequences, on the other hand, can be integrated with the "clock division" or "rotation" methods. If the operations continue for the product of the length of the bitstreams, the computation can produce deterministic and accurate results.

The "rotation" method used in the architecture of FIG. 6 converges faster and is more energy-efficient than the "clock division" method used by the architecture of FIG. 5. Although this disclosure describes using LD Sobol sequences and the "rotation" approach, the similar techniques can be applied to LD Halton sequences and the "relatively prime" method.

If run for $2^{i \cdot n}$ cycles, the "rotation" method guarantees a deterministic and accurate output by rotating the bit-streams through inhibiting or stalling on powers of the stream lengths. Counter 620A for Sobol generator 630A repeats every $2^n$ cycles but does not rotate or stall. Counters 620B-620N for other Sobol sources (source k=2, 3, . . . , i) have a period of $2^n$ but rotate every $2^{(k-1) \cdot n}$ cycles by inhibiting.

Additional counters 660A and 660B control these inhibits. Due to the use of n-bit Sobol generators instead of expensive i·n-bit generators, the architecture for the second LD method shown in FIG. 6 incurs a lower hardware cost than the architecture for the first LD method shown in FIG. 5.

FIG. 7 is a conceptual block diagram of an example Sobol sequence generator 700 configured to output multiple Sobol numbers in parallel, in accordance with some examples of this disclosure. FIG. 7 shows an example of Sobol sequence generator 700 configured to output four Sobol numbers in parallel. However, other Sobol sequence generators can be used to generate any number of Sobol values in parallel.

Counter 720 is configured to output multiple count values in parallel. For example, during a first clock cycle, counter 720 can output values of 0, 1, 2, and 3. During a second clock cycle, counter 720 can output values of 4, 5, 6, and 7, and so on. Shared circuitry 730 receives the values from counter 720 and controls separate circuitry 740A-740I to output a set of Sobol numbers in parallel to comparators 790A-790I. The Sobol numbers may be consecutive such that, during the first clock cycle, separate circuitry 740A-740I generates the first, second, third, and fourth Sobol numbers in a Sobol sequence. During the second clock cycle, separate circuitry 740A-740I generates the fifth, sixth, seventh, and eighth Sobol numbers in the Sobol sequence.

Shared circuitry 730 may include a least significant zero detector, an index or address generator, a direction vector storage array, and/or one D flip-flops. Separate circuitry 740A-740I may include one or more XOR gates for outputting Sobol numbers to comparators 790A-790I. Additional example details of parallel Sobol generators are described in "Towards Energy-Efficient Stochastic Circuits Using Parallel Sobol Sequences" by Liu et al., the entire contents of which are incorporated herein by reference.

Comparators 790A-790I are configured to output values of a bit sequence in parallel during each clock cycle based on comparing the value stored in constant number register 770 and the respective Sobol number. Using a parallel generator like Sobol sequence generator 700 can greatly reduce the latency of a computation unit (e.g., by a factor of four) with an increased hardware cost of twenty or thirty percent. The architectures shown in FIGS. 5 and 6 can use the parallel generator approach shown in FIG. 7. For example, each of Sobol generators 530A-530I and/or Sobol generators 630A-630I may be configured to include shared circuitry and separate circuitry for outputting multiple Sobol numbers in parallel.

FIGS. 8A-8C are tables of the error and area of alternative design approaches. The table in FIG. 8A compares the mean absolute error (MAE) of different methods by multiplying the measured mean value of each method by 100 and reporting value as a percentage. Due to inherent random fluctuations in generating bit-streams and correlation between bit-streams, conventional SC cannot produce completely accurate results in $2^{16}$ cycles (in the example of multiplying two 8-bit numbers). All the proposed deterministic methods, on the other hand, produce completely accurate results in $2^{16}$ cycles. The computational results were the same as the results from a conventional binary radix-based multiplier.

Due to the nature of unary representation (a bit-stream representation with first all 1s and then all 0s), truncating the bit-streams in the counter-based deterministic methods leads to a high truncation error. For example, when running the multiplication operation for $2^{15}$ cycles (processing $2^{15}$-bit bit-streams), the three counter-based deterministic methods showed a MAE of more than 3 percent. For applications where slight inaccuracy is acceptable, this high truncation error makes the conventional SC a better choice than the counter-based deterministic methods.

The high truncation error of the counter-based deterministic methods can be addressed by bringing randomization back into representation. Instead of counters, linear-feedback shift registers (LFSRs) can be used as the number source with the "relatively prime length," "rotation," and "clock division" methods. The table in FIG. 8A shows that, when truncating bit-streams, the three LFSR-based deterministic methods achieve a much lower MAE than their corresponding counter-based implementations. The LFSR-based relatively prime length and rotation methods even achieved a lower MAE than conventional SC.

The best MAEs, however, were produced by the two LD deterministic methods. When using the proposed LD methods, the MAEs of the truncated computation are significantly lower than those of the conventional SC and the counter-based and LFSR-based deterministic methods. For example, when running the two-input multiplication operation for $2^{15}$ cycles, the proposed LD methods achieve a MAE of approximately $10^{-3}$, which is 150×, 100×, and 3000× lower than the MAE of the conventional SC, the deterministic LFSR-based rotation, and the counter-based rotation methods, respectively.

Perfectly precise computations require the output resolution to be at least equal to the product of the input resolutions. To precisely compute the output of a logic gate given two proportions, each bit of one proportion must be operated on with every bit of the other proportion. For example, with proportions of size n and m, the precise output contains nm bits.

Assuming each independent input i has the same resolution $1/2^{n_{in}}$, the output resolution is given by $1/2^{n_{out}} = 1/2^{n_{in}i}$. With a conventional stochastic representation, bit-streams of $2^{2n}$-bit long are required to represent a value with $1/2^n$ precision. To ensure the generated bitstreams are sufficiently random and independent, each LFSR has at least as many states as the required output bit-stream. Therefore, to compute with perfect precision, each LFSR must have at least length $2n_{in}i$.

With the deterministic methods, the resolution n of each input i is determined by the length of its converter module number source. The output resolution is the product of the number source ranges. For example, with the "clock division" method, each converter module number source is connected in series. With i inputs each with resolution n, the series connection forms a large number source with $2^{ni}$ states. This shows that output resolution is not determined by the length of each individual number source, but by their concatenation. This allows for a large reduction in circuit area compared to the conventional stochastic method.

The table in FIG. 8B includes hardware costs for 3-input and 4-input stochastic multipliers with 4-bit and 8-bit precision. The table in FIG. 8B also reports the area numbers for a conventional binary radix multiplier. Among the bit-stream-based designs, the "relatively prime length" and "clock division" methods have the lowest hardware cost. These two methods and the "rotation" method have the lowest cost increase rate (~2×) from 2 inputs to 4 inputs. The first LD method, which had the fastest convergence, as shown in the table shown in FIG. 8A, has the highest hardware cost with highest cost increase rate (9×) from 2 inputs to 4 inputs. The second LD method, on the other hand, is also fast converging, but has a cost increase rate (2.5×) very close to the cost increase rates of the counter-based and LFSR-based deterministic methods. The conventional stochastic method is more costly than all implemented deterministic methods except the first LD method. The hardware cost of the binary radix-based multiplier increases by a factor of 7× going from 2 inputs to 4 inputs. This increase is greater than all the proposed methods except the first LD method.

An important metric, however, to evaluate the efficiency of different methods is the area-delay product as an estimation of energy consumption. The area-delay of the implemented 8-bit precision multipliers for different MAEs is shown in the table shown in FIG. 8C. When an application can tolerate some small degree of inaccuracy and only a few independent bit-streams are used, the second and the parallel version of the first LD-based methods are the best choices. Note that some SC-based implementations of neural networks require only two independent sources for generating bit-streams. These LD-based methods provide the minimum area-delay product for the Robert's cross edge detection circuit.

The table in FIG. 8C compares the hardware footprint, delay, and area-delay product numbers. To comprehensively test the designs, the operation of the Robert's cross circuit was simulated in each design approach by processing 2,000 sets of 8-bit precision random input values. For the accurate representation of input values in each design, integer values were randomly chosen between zero and the period of the number generators, and the integer values were divided by their period.

Figure 9:
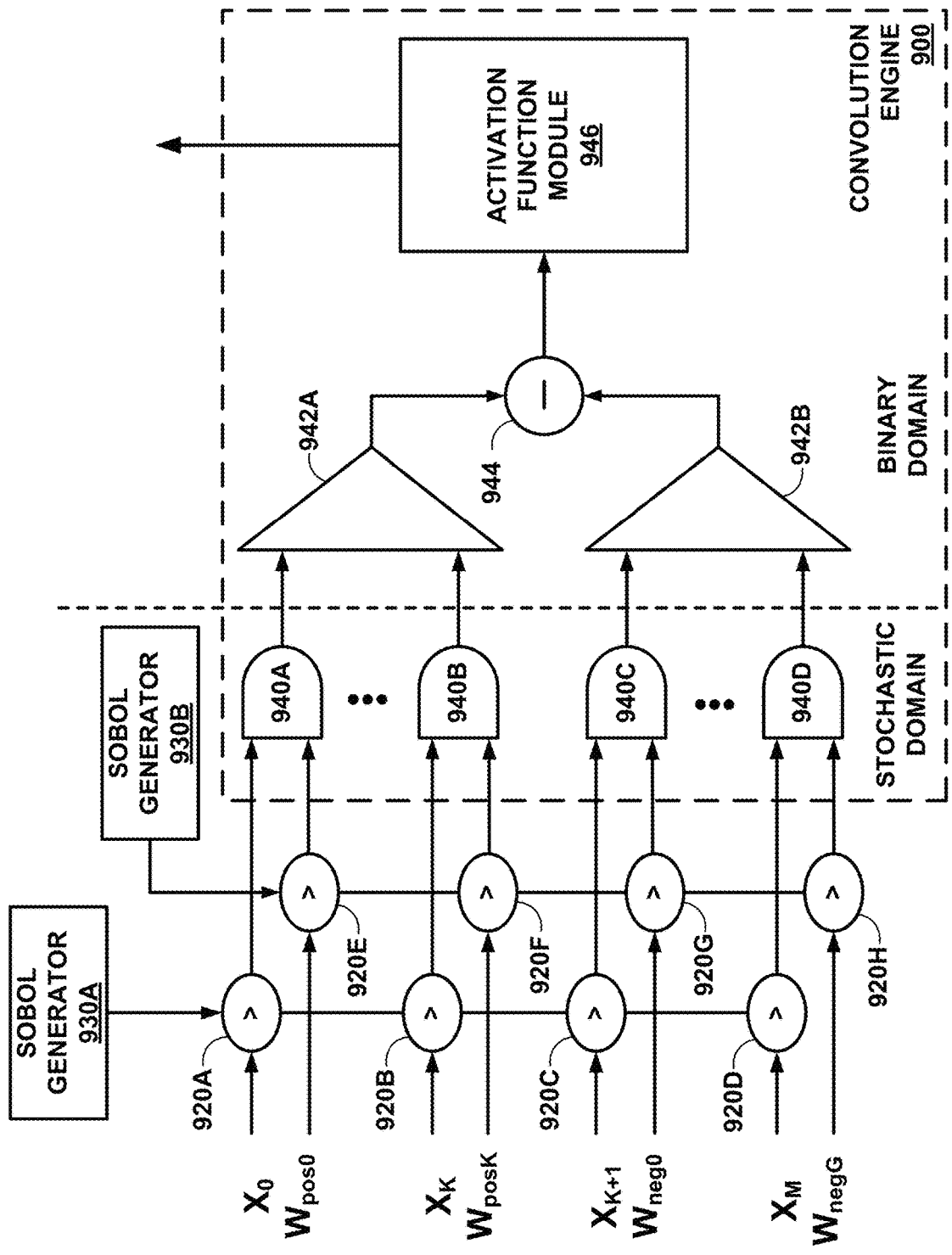
FIG. 9 is a conceptual block diagram of a proposed hybrid design for a convolutional layer.

FIG. 9 is a conceptual block diagram of a proposed hybrid design for a convolutional layer. Convolution engine 900 may be part of a convolutional neural network (NN) that includes convolutional layers followed by pooling layers and fully connected layers. The convolutional layer can extract a feature map from its input by applying a set of filters (kernels) and by activating them when specific types of features are found. Each pixel in a feature map is a convolution neuron which is obtained by the convolution of a filter-sized moving window and the inputs in the moving window. The activation functions that are used to extract specific types of features from the convolution neurons are non-linear transformation functions, such as hyperbolic tangent (tanh) or Rectified Linear Units (ReLU).

To reduce the dimensions of feature maps and mitigate over-fitting issues, a subsampling technique can be applied to data by a pooling layer. There are various subsampling techniques such as max pooling, L2-norm pooling, and average pooling. The fully connected layer fully connects its input to all activated neurons of its previous layer. Each neuron in the fully connected layer computes dot-product (inner-product) of its inputs and corresponding weights. To specify the deviation between the predicted and real labels in the network training process, a loss function such as a sigmoid cross-entropy loss, softmax loss, or Euclidean loss can be used as a loss layer.

In the example shown in FIG. 9, multiplication operations are performed in the bit-stream domain or stochastic domain. 930A and 930B produce two different Sobol sequences to convert the two inputs of each multiplication operation to corresponding bit-stream representation. Each of bit-stream generators 920A-920D receives the Sobol sequence produced by generator 930A, and each of bit-stream generators 920E-920H receives the Sobol sequence produced by generator 930B. This architecture causes each of AND gates 940A-940D to receive two independently generated bit-streams. In some examples, each of generators 930A and 930B may implement a parallel architecture for delivering more than one Sobol number each clock cycle to generators 920A-920H.

Multiplications are implemented using AND gates 940A-940D instead of costly fixed-point binary multipliers. Deterministic computation is performed on the bit-streams generated by generators 920A-920H and the output bit-streams are converted back to binary format implicitly by accumulating the output bit-streams in the binary domain using conventional binary adders.

Since accumulating the outputs of multiplications is performed in the binary domain by accumulators 942A and 942B, the correlation between the produced output bit-streams does not affect the accuracy of the accumulation. As a result, only two different Sobol sequence generators 930A and 930B are sufficient to convert all input data to bit-stream representation. The generated bit-streams will be re-used by a large number of multiplication units, minimizing the overhead of bit-stream generators in the overall cost of the NN design.

The weight inputs of the multiplication operations involve both positive and negative data. The common approach of handling negative data in the stochastic domain is through extending the range of numbers from [0,1] to [−1,1] using a linear transformation and processing bit-streams in a so-called stochastic bipolar domain. This method, however, requires a longer processing time for the same accuracy. The architecture shown in FIG. 9 divides the weights into positive and negative subsets and convert them to bit-stream representation assuming that all are positive values (taking the absolute value of the negative values). Accumulators 942A and 942B separately sum the multiplication outputs of the "positive" subset and the "negative" subset. Operator 944 then subtracts the sums from each other to produce the final output value for activation function module 946.

Figure 10:
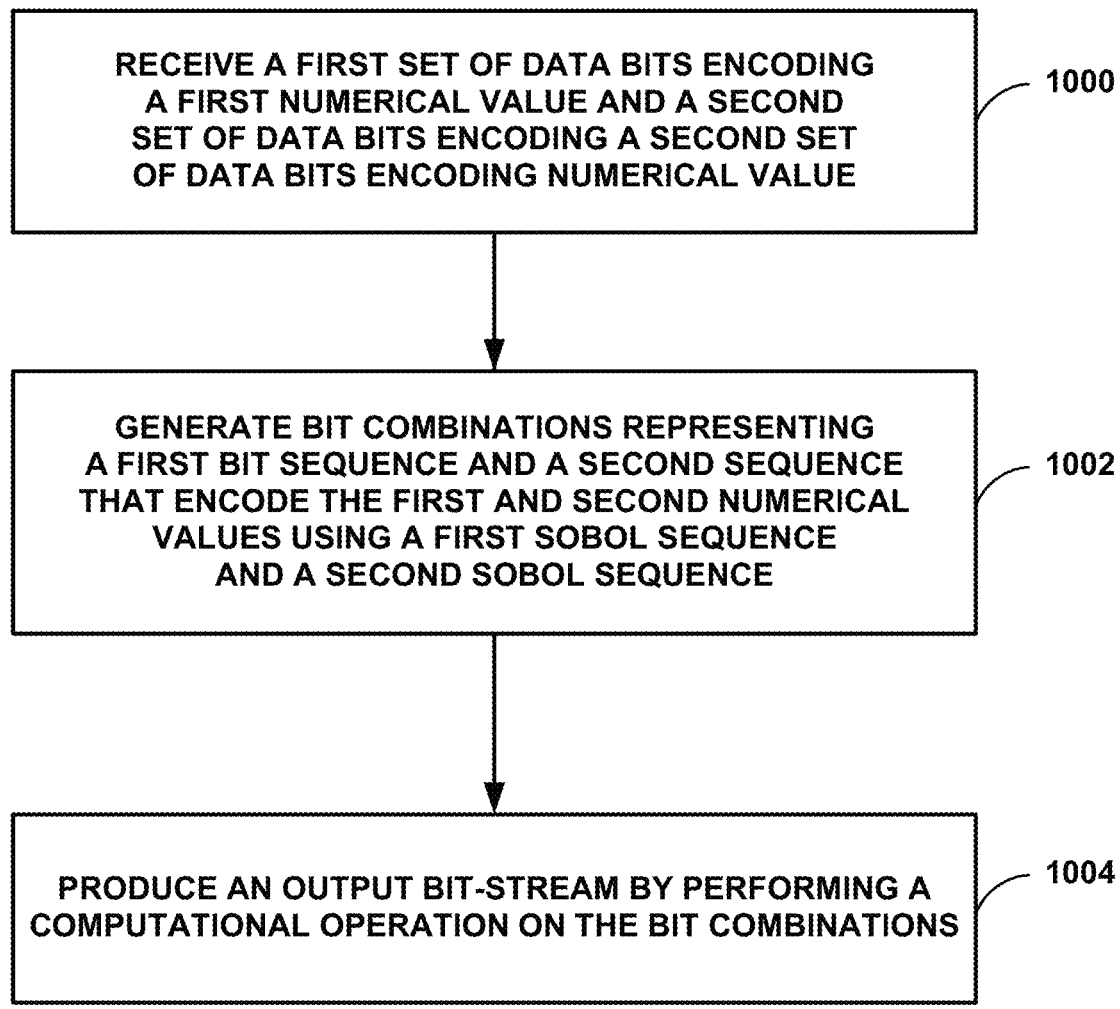
FIG. 10 is a flow diagram illustrating example techniques for performing computation on portions of a binary number.

FIG. 10 is a flow diagram illustrating example techniques for performing computation on portions of a binary number. The techniques of FIG. 10 are described with reference to computational unit 100 shown in FIG. 1, although other components may exemplify similar techniques.

In the example of FIG. 10, bit-stream generator 120 receives input sets of data bits 110 and 112 (1000). In examples in which bit-stream generator 120 receives input sets 110 and 112 as binary numbers, bit-stream generator 120 can store the binary numbers to constant number registers (e.g., register 170). Bit-stream generator 120 generates bit combinations representing a first bit sequence and a second bit sequence that encode the first and second numerical values using Sobol sequence source 160 and a second Sobol sequence source (1002). Each of the Sobol sequence sources generates a low-discrepancy, quasi-random series of Sobol numbers. By comparing quasi-random Sobol numbers 160 with constant number 170, comparator 190 can generate a bit-stream encoding the numerical value of constant number 170.

In the example of FIG. 10, computation logic 160 produces output bit-stream 190 by performing a computational operation on the bit combinations (1004). For example, computation logic 160 can perform multiplication on operand bit-streams 130 and 132 by feeding bit-streams 130 and 132 into the inputs of an AND gate. Computation logic 160 can perform scaled addition on operand bit-streams 130 and 132 by feeding bit-streams 130 and 132 into the inputs of a multiplexer.

Computation can be performed in the stochastic domain by splitting the resolution of binary numbers for deterministic or stochastic computation. SC systems that perform deterministic or stochastic computation on two or more binary numbers convert each binary number to a bit-stream (e.g., deterministic, stochastic, unary, etc.) such that each bit-stream encodes the same numerical value as the respective binary number. The bit-streams are fed into computation logic that operates on the bit-streams to generate an output bit-stream that can be converted into binary format.

However, it is also possible to utilize resolution splitting circuits in which an input binary number is split into at least two binary portions, and the portions are subsequently converted to a set of respective bit-stream for processing. Computation logic then operates on the bit-streams similar to computation without resolution splitting, but the resulting bit-streams represent only sub-results of the computation. The sub-results can be combined by an accumulator to provide results representative of sums, shifts, multiplies, and/or concatenates of the set of bit-streams processed and output by the computation logic.

As compared to pure-binary computation using binary values, resolution splitting for bit-stream computation, including deterministic or stochastic computation as described herein, can use less chip space and be more tolerant of bit flips and other errors. As compared to deterministic stochastic computation without resolution splitting for input binary number(s), the techniques described herein for resolution splitting for deterministic and/or stochastic computation may use more chip space but have lower error rates for short computation runs (e.g., the square of the length of the bit-stream).

Figure 11:
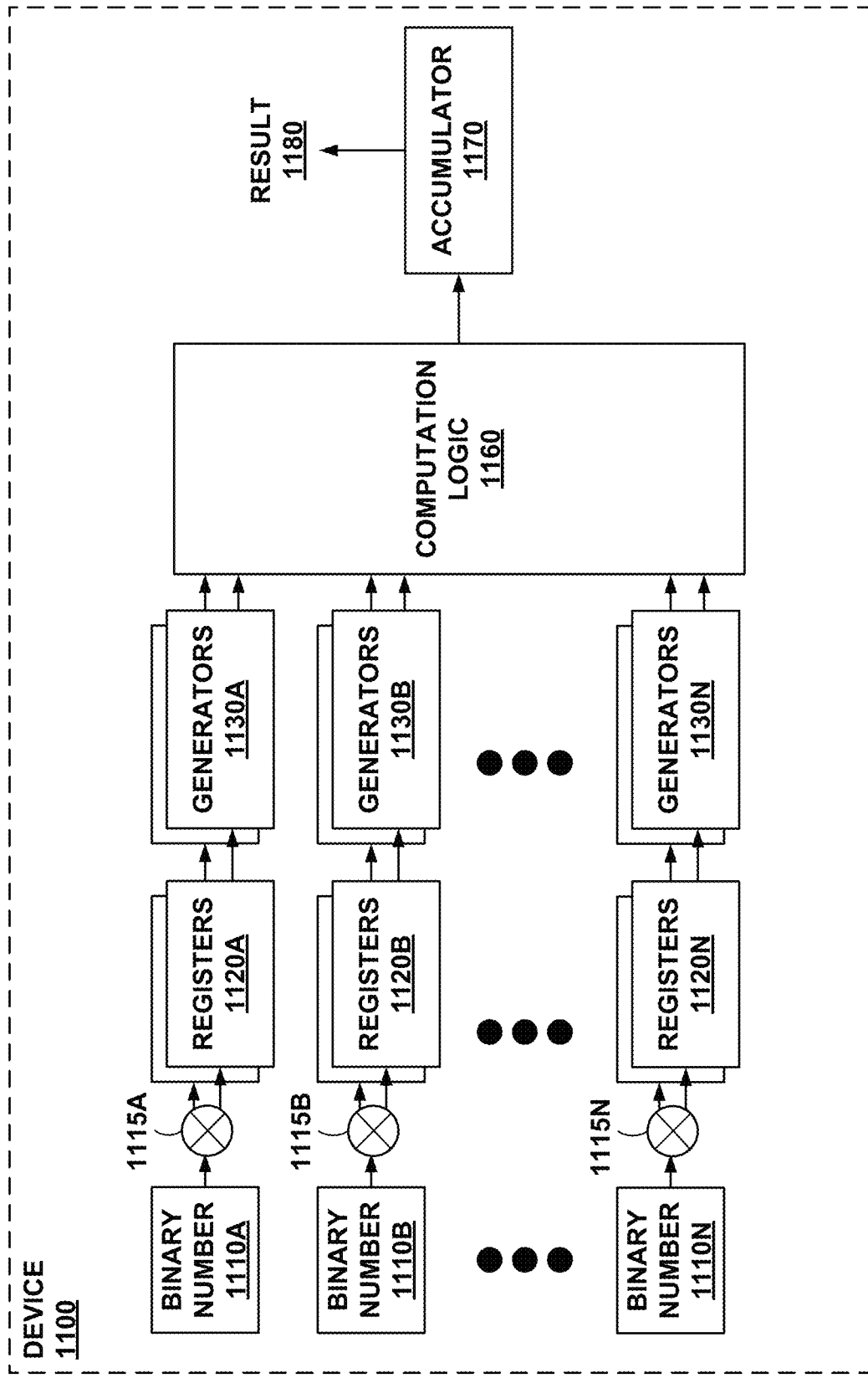
FIG. 11 is a conceptual block diagram of a device configured to perform deterministic computation with resolution splitting, in accordance with some examples of this disclosure.

FIG. 11 is a conceptual block diagram of a device 1100 configured to perform deterministic computation with resolution splitting, in accordance with some examples of this disclosure. Although described as implementing deterministic computation, device 1100 can also implement stochastic computation. Device 1100 may be part of or include one or more integrated circuits, a sensor, an image or signal processor, a video processing circuitry, a camera, a mobile device, a digital chip, a machine learning device, or another suitable device. The techniques of this disclosure may be especially useful for approximate computing applications and applications that tolerate some degree of uncertainty, such as video processing, image tagging, and neural networks.

Binary numbers 1110A-1110N encode numerical values (i.e., operands), and the encoding of input sets 1110 and 1112 may take the form of binary encoding. Binary numbers 1110A-1110N may each have the same bit length, such that each of binary numbers 1110A-1110N has N bits of data. N may be any integer, such as eight, ten, twelve, or sixteen. Device 11100 can receive binary numbers 1110A-1110N as any form of binary-encoded bits, such as edge coding (e.g., one-hot or one-cold coding). Device 1100 receives binary numbers 1110A-1110N as parallel data bits, serial data bits, and/or a combination of parallel and serial data bits.

Device 1100, using splitters 1115A-1115N, can split each of binary numbers 1110A-1110N into K portions or sub-values. For example, binary number 1110A may have eights bits (N=8) and represent seventy out of a maximum value of 255 (e.g., a scaled value of 0.2745), such that binary number 1110A includes the following bits: 01000110. In examples in which K equals two, device 1100 can store binary number 1110A in two separate four-bit registers 1120A as 0100 (the most significant bits) and 0110 (the least significant bits). The bit length of each portion is represented by the variable M, which equals four in this example. Thus, there may be two registers 1120A to store the two M-bit portions of binary number 1110A. Although the system of FIG. 1 illustrates the use of multiple registers for storing each binary sub-portion of each input binary number 1110, a reduced number of registers (e.g., a single larger register) may be used to store the sub-portions of a binary number.

In some examples, analog signals may be used as inputs for device 1100 instead of binary numbers 1110A-1110N. Additional example details of using analog inputs for deterministic or stochastic computing can be found in commonly assigned U.S. Provisional Patent Application Ser. No. 62/735,584, filed on Sep. 24, 2018, entitled "Stochastic Computing with Analog Memory," which is incorporated herein by reference in its entirety.

Generators 1130A-1130N are configured to convert the portions of binary numbers 1110A-1110N stored in registers 1120A-1120N to bit-streams. Device 1100 can include a bit-stream generator for each portion of a binary number. In examples in which device 1100 receives four binary numbers and splitters 1115A-1115N splits each binary number into two portions (K=2), device 1100 may include eight registers and eight bit-stream generators. Each of generators 1130A-1130C is configured to convert a respective portion of a binary number to a bit-stream, such as a deterministic, unary, stochastic, random, pseudo-random, and/or quasi-random bit-stream. FIGS. 2-7 illustrate example Sobol sequence generators for generators 1130A-1130N.

Generators 1130A-1130C may generate bit-streams using a random number generator, a pseudo-random number generator (e.g., a linear-feedback shift register), or a quasi-random number generator (e.g., a Sobol sequence generator). For example, a high bit may be generated when the respective binary number is greater than a random number. When the random number is greater than or equal to the respective binary number, the generator outputs a low bit. Each of generators 1130A-1130N receives a portion of a binary number and compares the portion to a random number to generate each bit of the output bit-stream. A binary number of seventy (01000110) split into two portions would result in bit-streams representing ⁴⁄₁₆ for 0100 for the most significant bits (MSB) portion and ⁶⁄₁₆ for 0110 for the low significant bits (LSB) portion.

The bit-streams outputted by generators 1130A-1130N may include a string of zeroes and ones (e.g., low and high voltage levels) to encode a numerical value. For example, the value of 0.3 or the fraction ³⁄₁₀ may be encoded in ten data bits as 1001000010 or 0110000100. A unary bit-stream always encodes 0.3 in ten data bits as 1110000000 or 0000000111, where the three one's are moved to the beginning or end of the bit-stream and the seven zeroes are moved to the beginning or end of the bit-stream. Edge coding encodes 0.3 in ten data bits as 0000001000 for one-hot coding or 1111110111 for one-cold coding. Moreover, a stochastic bit-stream may encode 0.3 in a random manner, while a deterministic and/or pseudo-random bit-stream can encode a numerical value in a manner that appears random but is actually predictable based on the function or algorithm used to generate the bit-stream. In some examples, each of generators 1130A-1130N and/or conversion circuits 1230-1233 may implement a relatively prime method, clock division method, or rotation method to ensure that each bit of a first operand bit-stream is matched up with each bit of a second operand bit-stream.

In some examples, each bit-stream may include a pulse-width modulated (PWM) signal that encodes a numerical value as a function of the duty cycle of the PWM signal. Additional example details of PWM signals may be found in commonly assigned U.S. Patent Application Publication No. 2018/0204131, filed on Jan. 12, 2018, entitled "Stochastic Computation Using Pulse-Width Modulated Signals," which is incorporated herein by reference in its entirety.

In some examples, a first one of generators 1130A, a first one of generators 1130B, and a first one of generators 1130N may be configured to receive a Sobol number from a first Sobol source. A second one of generators 1130A, a second one of generators 1130B, and a second one of generators 1130N may be configured to receive a Sobol number from a second Sobol source.

Computation logic 1160 performs one or more computation operations on the operand bit-streams generated by generators 1130A-1130N. The bit-streams output by computation logic 1160 encode numerical values that are the result of the computation operation performed by computation logic 1160. In examples in which computation logic 1160 includes an AND gate for performing multiplication, input bit-streams of 1001 and 1100 would result in an output bit-stream of 1000.

Computation logic 1160 represents a functional component, e.g., a processing unit and/or a digital logic unit, designed to perform operations, such as arithmetic operations, image processing, video processing, signal processing, and the like. Computation logic 1160 may include stochastic processing circuitry such one or more logic gates (e.g., AND gates, OR gates, XOR gates, etc.), transistors, resistors, capacitors, diodes, and/or any other suitable components. In some examples, computation logic 1160 may include a scaling network and/or a shuffling network.

Accumulator 1170 receives the sub-result bit-streams produced by computation logic 1160 and combines the sub-result bit-streams to produce a result, which may be encoded as a bit-stream or a binary number. For example, device 1100 may receive two eight-bit binary numbers and split each binary number into two portions, producing four portions: two MSB portions and two LSB portions. Device 1100 may include an adder tree (not shown in FIG. 1) to add sub-results with the same offset value. For example, computation logic 1160 can operate on an LSB portion of a first binary number and an MSB portion of a second binary number to produce a first sub-result. Computation logic 160 can operate on an MSB portion of the first binary number and an LSB portion of the second binary number to produce a second sub-result. Because the first and second sub-results have the same offset value (e.g., equal to the difference in offset between the MSB and LSB portions), the adder tree can sum the first and second sub-results.

Accumulator 1170 can adjust each sub-result based on the offset value for that sub-result. In examples in which each binary number has eight bits and is split into two portions, the sub-result of two MSB portions would have an offset value of eight bits, the sub-result of an LSB portion and an MSB portion would have an offset value of four bits, and the sub-result of two LSB portions would have an offset value of zero bits. The adder tree sums the sub-result with equal offset values. Accumulator 1170 can apply the offset values by converting the sub-result bit-streams to sub-result binary numbers and shifting the sub-result binary numbers by the respective offset value. Thus, a sub-result binary number of 1001 with an offset value of four bits would become 10010000 (e.g., shifted to the left by four bits). After applying the offset values to the sub-result binary numbers to produce offset binary numbers, accumulator 1170 can sum or concatenate the offset binary numbers to produce result 1180.

Device 1100 can run computations for shorter periods of time with lower error rates, as compared to deterministic computation without resolution splitting. Thus, device 1100 may have lower error rates and lower latency, as compared to deterministic computation without resolution splitting.

Resolution splitting may involve circuitry that takes up more chip space than deterministic computation without resolution splitting, but deterministic computation with resolution splitting may still take up less chip space than binary computation.

Device 1100 can implement an acceleration method based on resolution splitting to mitigate the long latency of other deterministic methods of stochastic computing (SC). Deterministic approaches of SC can remove the random fluctuation and correlation problems of SC and so produce completely accurate results with stochastic logic. However, deterministic approaches can have long processing times when a deterministic zero error rate output is expected. For instance, when multiplying two N-bit precision input values, a processing time of $2^{2N}$ cycles is required for an error rate of zero. This long processing time makes the deterministic approaches without resolution splitting inefficient for many applications.

Device 1100 uses a hybrid bitstream-binary resolution splitting technique to mitigate the long latency and the high energy consumption problem of the deterministic computation on bit-streams. The end result is an exponential reduction in the processing time at the cost of some increase in the hardware area. The exponential reduction in the processing time further results in a significant reduction in energy consumption.

Other deterministic approaches to SC must run for a large number of clock cycles to guarantee completely accurate results. In case of operating on i N-bit resolution data represented by i $2^N$-bit length independent bit-streams, the operation must run for $2^{i*N}$ cycles (i.e., the product of the length of bit-streams) to guarantee a completely accurate result. This large number of cycles required by other deterministic approaches results in energy inefficiency for many applications. Increasing the number of independent inputs can further worsen the problem, which means a very limited scalability. Device 1100, in contrast, reduces the operation time and the energy consumption of these deterministic methods exponentially, resulting in more efficient operations for different applications.

Truncating bit-streams can improve the processing time and energy consumption of deterministic methods. However, truncation leads to losing accuracy as parts of the information are discarded. Time-encoding of data can improve the processing time of deterministic bit-stream processing. Input data can be converted into pulse-width modulated signals and processed with the same digital stochastic logic. A significant improvement is achieved with this mixed-signal technique. However, the use of PWM signals can involve the conversion into the time domain, rather than using digital bit-stream processing for computation.

Device 1100 uses a hybrid bit-stream-binary approach that improves the processing time and energy consumption of other deterministic methods of computation with bit-streams. By resolution splitting the input data, an exponential reduction in the processing time and energy consumption is achieved. Device 1100 can implement two important operations of bit-stream-based computing, multiplication and scaled addition, as well as other logical operations. Low cost, high performance, and yet energy-efficient implementation of these operations is most useful for applications that can tolerate slight inaccuracy such as neural networks and image processing applications.

Figure 12:
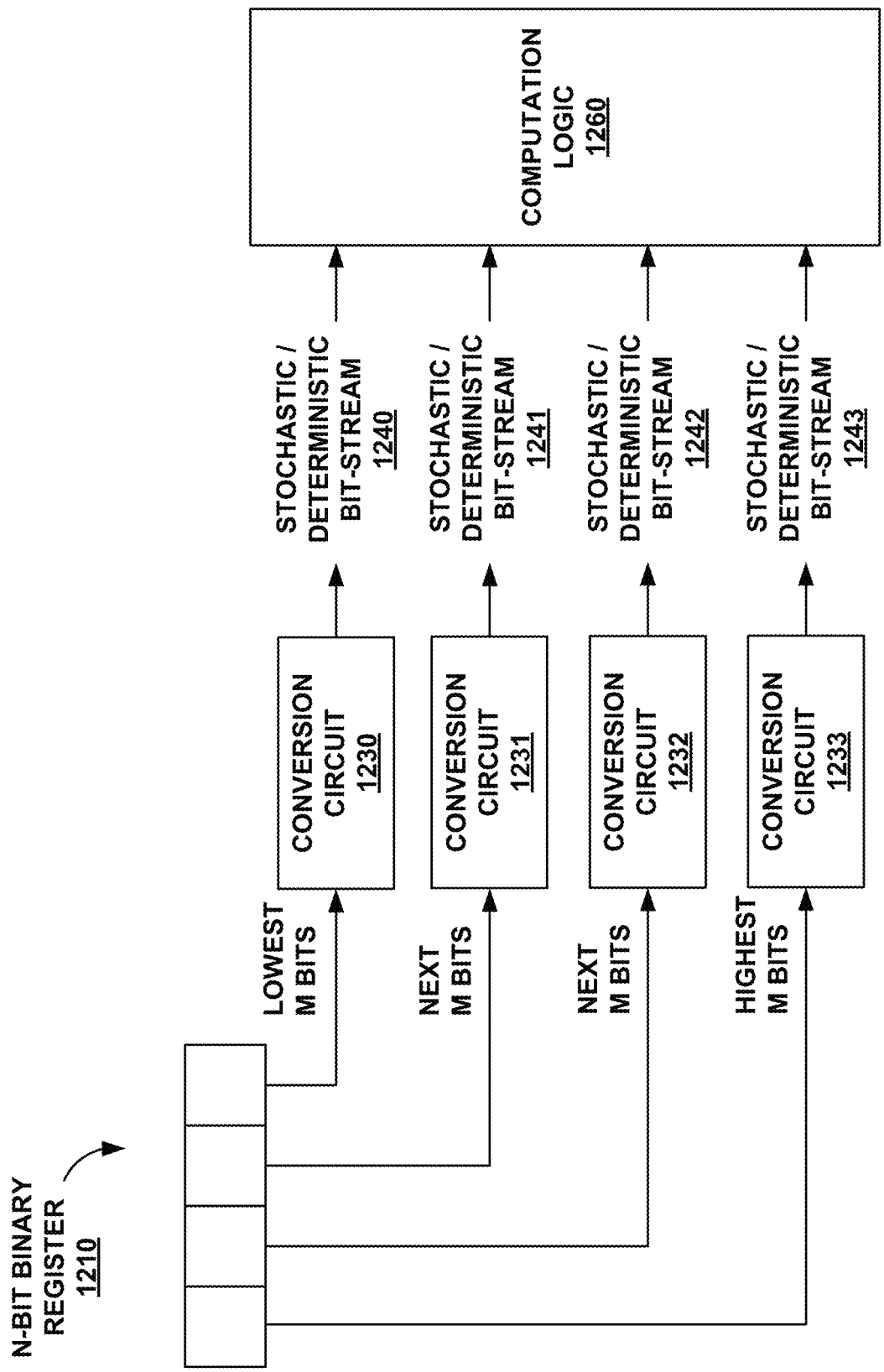
FIG. 12 is a conceptual block diagram of splitting the resolution of a binary number and generating four bit-streams for computation.

FIG. 12 is a conceptual block diagram of splitting the resolution of a binary number and generating four bit-streams 1240-1243 for computation. Binary register 1210 receives and stores an N-bit binary number in four portions (K=4), where each portion has M bits. For example, where N equals sixteen, M equals four. Conversion circuit 1230 converts the four LSBs to bit-stream 1240, which may be a stochastic, deterministic, unary, and/or edge-coded bit-stream. Bit-stream 1240 has an offset value of zero bits because bit-stream 1240 represents the lowest M bits of the input binary number.

Conversion circuit 1231 converts the next lowest M bits to bit-stream 1241, which has an offset value of M bits. Bit-stream 1242 has an offset value of 2M bits, and bit-stream 1243 has an offset value of 3M bits. Computation logic 1260 can operate on bit-streams 1240-1243 and bit-streams generated using portions of another binary number. In some examples, each of generators 1130A-1130N, computation logic 1160 and 1260, accumulator 1170, and/or conversion circuits 1230-1233 may include asynchronous local clocks or a global clock with relaxed clock arrival requirements.

Figure 13:
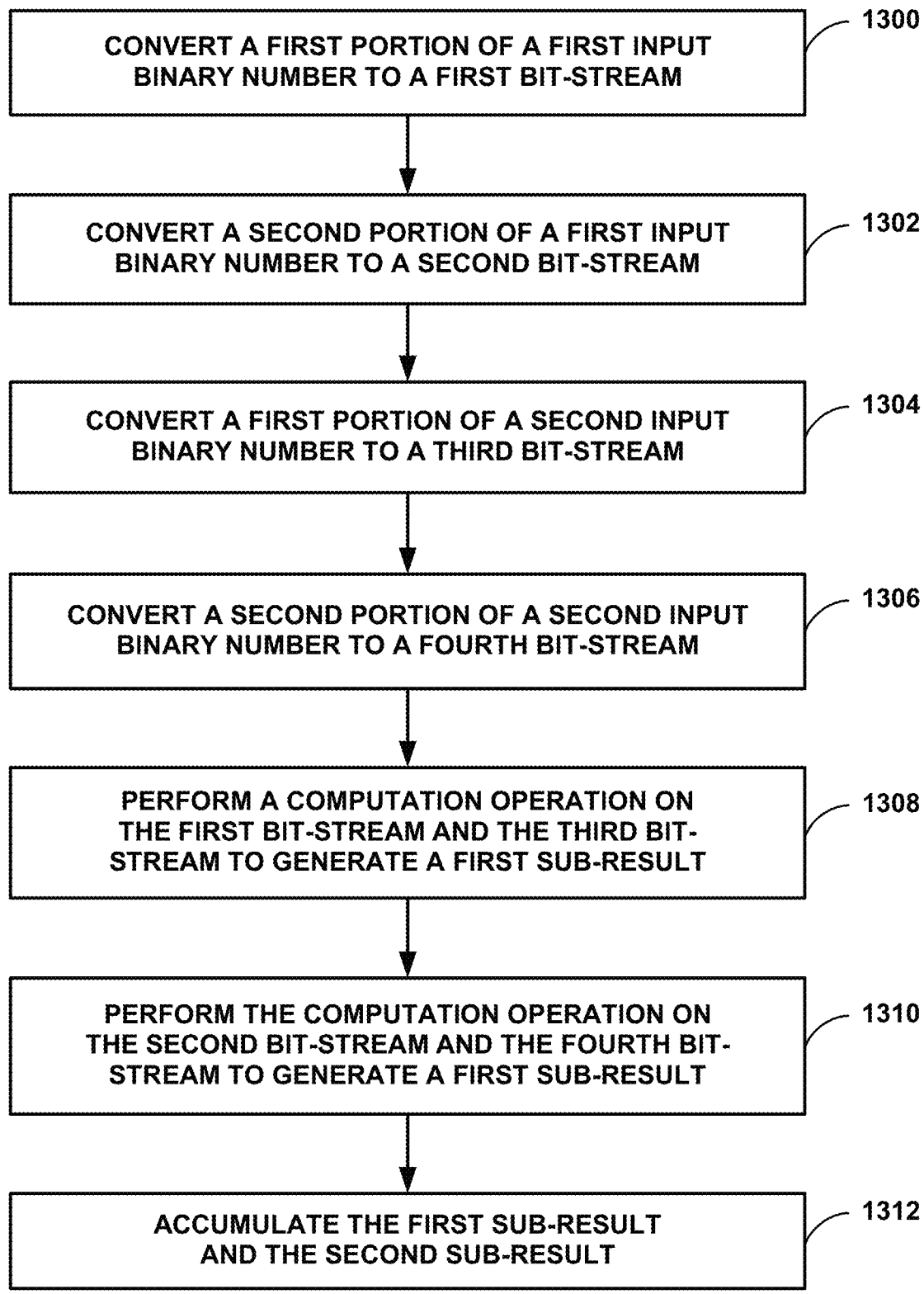
FIG. 13 is a flow diagram illustrating example techniques for performing computation on portions of a binary number.

FIG. 13 is a flow diagram illustrating example techniques for performing computation on portions of a binary number. The techniques of FIG. 13 are described with reference to device 1100 shown in FIG. 11, although other components may exemplify similar techniques.

In the example of FIG. 13, generators 1130A convert a first portion of binary number 1110A to a first bit-stream (1300) and convert a second portion of binary number 1110A to a second bit-stream (1302). Generators 1130B convert a first portion of binary number 1110B to a third bit-stream (1304) and convert a second portion of binary number 1110B to a fourth bit-stream (1306).

In the example of FIG. 13, computation logic 1160 performs a computation operation on the first and third bit-streams to generate a first sub-result (1308). Computation logic 1160 performs a computation operation on the second and fourth bit-streams to generate a second sub-result (1310). If the offset values of the first and second sub-results are the same, computation logic 1160 can accumulate the first and second sub-results by summing the first and second sub-results (1312). If the offset values of the first and second sub-results are not the same, computation logic 1160 can shift the first and/or second sub-results and then sum or concatenate the shifted sub-results.

This disclosure has attributed functionality to bit-stream generators 120, 122, 124, and 1130A-1130N, computation logic 140 and 1160, comparator 190, and/or accumulator 1170. Bit-stream generators 120, 122, 124, and 1130A-1130N, computation logic 140 and 1160, comparator 190, and/or accumulator 1170 may include one or more processors. Bit-stream generators 120, 122, 124, and 1130A-1130N, computation logic 140 and 1160, comparator 190, and/or accumulator 1170 may include any combination of integrated circuitry, discrete logic circuitry, analog circuitry, such as one or more microprocessors, digital signal processors (DSPs), application specific integrated circuits (ASICs), and/or field-programmable gate arrays (FPGAs). In some examples, bit-stream generators 120, 122, 124, and 1130A-1130N, computation logic 140 and 1160, comparator 190, and/or accumulator 1170 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as bit-stream generators 120, 122, 124, and 1130A-1130N, computation logic 140 and 1160, comparator 190, and/or accumulator 1170. Example non-transitory computer-readable storage media may include RAM, ROM, programmable ROM (PROM), erasable programmable ROM (EPROM), electronically erasable programmable ROM (EEPROM), flash memory, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Various examples of the disclosure have been described. Any combination of the described systems, operations, or functions is contemplated. These and other examples are within the scope of the following claims.

The invention claimed is:

1. A device comprising:
an integrated circuit comprising a computational unit configured to process at least a first set of data bits encoding a first numerical value and a second set of data bits encoding a second numerical value,
wherein the computational unit comprises:
a bit-stream generator configured to generate bit combinations representing a first bit sequence and a second bit sequence that encode the first and second numerical values, respectively, based on a proportion of the data bits in the sequence that are high relative to the total data bits in the sequence, wherein a subset of the bit combinations pairs a data bit of the first bit sequence with multiple different data bits of the second bit sequence, wherein the first bit sequence is generated using a first Sobol sequence source, wherein the second bit sequence is generated using a second Sobol sequence source different from the first Sobol sequence source, and
computation logic configured to:
perform a computational operation on the bit combinations; and
produce an output bit-stream having a set of data bits indicating a result of the computational operation, wherein the data bits of the output bit-stream represent the result based on a probability that any data bit in the set of data bits of the output bit-stream is high.

2. The device of claim 1, wherein the first Sobol sequence source is generated by reversing an order of output bits of a counter.

3. The device of claim 1,
wherein the first bit sequence is generated by comparing the first set of data bits and the first Sobol sequence source, and
wherein the second bit sequence is generated by comparing the second set of data bits and the second Sobol sequence source.

4. The device of claim 1,
wherein the computation logic is configured to select a length of the output bit-stream,
wherein the length of the output bit-stream is less than $2^{\wedge}(2N)$ data bits, and
wherein N is a length of the first bit sequence.

5. A device configured to process a first set of data bits encoding a first numerical value and a second set of data bits encoding a second numerical value, the device comprising:
a counter configured to generate an output;
a first Sobol sequence source configured to generate a first Sobol sequence based on the output of the counter;
a second Sobol sequence source configured to generate a second Sobol sequence based on the output of the counter, wherein the second Sobol sequence source is different from the first Sobol sequence source, and wherein the first Sobol sequence source and the second Sobol sequence source are directly driven by the counter;
a first comparator configured to generate a first bit sequence based on the first Sobol sequence and a first constant number; a second comparator configured to generate a second bit sequence based on the second Sobol sequence and a second constant number; and
computation logic configured to:
perform a computational operation on the first bit sequence and the second bit sequence; and
produce an output bit-stream having a set of data bits indicating a result of the computational operation, wherein the data bits of the output bit-stream represent the result based on a probability that any data bit in the set of data bits of the output bit-stream is high.

6. The device of claim 5,
wherein the counter is configured to generate the output by generating two or more count values in parallel,
wherein the first Sobol sequence source is configured to generate the first Sobol sequence by generating a first set of Sobol numbers in parallel based on the two or more count values generated by the counter, and
wherein the second Sobol sequence source is configured to generate the second Sobol sequence by generating a second set of Sobol numbers in parallel based on the two or more count values generated by the counter.

7. The device of claim 6, further comprising:
a first set of comparators comprising the first comparator, wherein each comparator of the first set of comparators is configured to generate a respective bit sequence based on a respective one of the first set of Sobol numbers, and
a second set of comparators comprising the second comparator, wherein each comparator of the second set of comparators is configured to generate a respective bit sequence based on a respective one of the second set of Sobol numbers.

8. The device of claim 6,
wherein the first set of Sobol numbers comprises two or more consecutive values of the first Sobol sequence, and
wherein the second set of Sobol numbers comprises two or more consecutive values of the second Sobol sequence.

9. The device of claim 5,
wherein the computation logic is a first set of computation logic,
wherein the output bit-stream is a first sub-result bit-stream,
wherein the first constant number is a first portion of a first input binary number,
wherein the second constant number is a first portion of a second input binary number, and
wherein the device further comprises:
a third bit-stream generator configured to generate a third bit-stream based on a numerical value represented by a second portion of the first input binary number;
a fourth bit-stream generator configured to generate a fourth bit-stream based on a numerical value represented by a second portion of the second input binary number;

a second set of computation logic configured to operate on the third bit-stream and the fourth bit-stream to generate a second sub-result bit-stream; and an accumulator configured to generate a binary result based on the first sub-result bit-stream and the second sub-result bit-stream.

10. The device of claim 9,
wherein the third bit-stream generator comprises a third comparator configured to generate the third bit-stream based on the first Sobol sequence and the second portion of the first input binary number, and
wherein the fourth bit-stream generator comprises a fourth comparator configured to generate the fourth bit-stream based on the second Sobol sequence and the second portion of the second input binary number.

11. The device of claim 9,
wherein the second portion of the first input binary number is different than the first portion of the first input binary number, and
wherein the second portion of the second input binary number is different than the first portion of the second input binary number.

12. The device of claim 9, further comprising an adder tree configured to:
add the first and second sub-result bit-streams to generate a summed bit-stream; and
deliver the summed bit-stream to the accumulator.

13. A device configured to process a first set of data bits encoding a first numerical value and a second set of data bits encoding a second numerical value, the device comprising:
a first counter;
a second counter configured to stall based on an output of the first counter;
a first Sobol sequence source configured to generate a first Sobol sequence based on an output of the first counter;
a second Sobol sequence source configured to generate a second Sobol sequence based on an output of the second counter, wherein the second Sobol sequence source is different from the first Sobol sequence source;
a first comparator configured to generate a first bit sequence based on the first Sobol sequence and a first constant number;
a second comparator configured to generate a second bit sequence based on the second Sobol sequence and a second constant number; and
computation logic configured to:
perform a computational operation on the first bit sequence and the second bit sequence; and
produce an output bit-stream having a set of data bits indicating a result of the computational operation, wherein the data bits of the output bit-stream represent the result based on a probability that any data bit in the set of data bits of the output bit-stream is high.

14. The device of claim 13, wherein the second counter is configured to stall in response to the output of the first counter matching a particular value.

15. The device of claim 13,
wherein the first counter comprises a first N-bit counter, and
wherein the second counter comprises a second N-bit counter configured to stall no more than once per 2^N counts.

16. The device of claim 13,
wherein the first counter configured to generate a first set of two or more count values in parallel,
wherein the first Sobol sequence source is configured to generate the first Sobol sequence by generating a first set of Sobol numbers in parallel based on the first set of two or more count values generated by the first counter,
wherein the second counter configured to generate a second set of two or more count values in parallel, and
wherein the second Sobol sequence source is configured to generate the second Sobol sequence by generating a second set of Sobol numbers in parallel based on the second set of two or more count values generated by the second counter.

17. The device of claim 16, further comprising:
a first set of comparators comprising the first comparator, wherein each comparator of the first set of comparators is configured to generate a respective bit sequence based on a respective one of the first set of Sobol numbers, and
a second set of comparators comprising the second comparator, wherein each comparator of the second set of comparators is configured to generate a respective bit sequence based on a respective one of the second set of Sobol numbers.

18. The device of claim 16,
wherein the first set of Sobol numbers comprises two or more consecutive values of the first Sobol sequence, and
wherein the second set of Sobol numbers comprises two or more consecutive values of the second Sobol sequence.

19. The device of claim 13,
wherein the computation logic is a first set of computation logic,
wherein the output bit-stream is a first sub-result bit-stream,
wherein the first constant number is a first portion of a first input binary number,
wherein the second constant number is a first portion of a second input binary number, and
wherein the device further comprises:
a third bit-stream generator configured to generate a third bit-stream based on a numerical value represented by a second portion of the first input binary number;
a fourth bit-stream generator configured to generate a fourth bit-stream based on a numerical value represented by a second portion of the second input binary number;
a second set of computation logic configured to operate on the third bit-stream and the fourth bit-stream to generate a second sub-result bit-stream; and
an accumulator configured to generate a binary result based on the first sub-result bit-stream and the second sub-result bit-stream.

20. The device of claim 19,
wherein the third bit-stream generator comprises a third comparator configured to generate the third bit-stream based on the first Sobol sequence and the second portion of the first input binary number, and
wherein the fourth bit-stream generator comprises a fourth comparator configured to generate the fourth bit-stream based on the second Sobol sequence and the second portion of the second input binary number.

21. A method comprising:
receiving, at a bit stream generator, a first set of data bits encoding a first numerical value and a second set of data bits encoding a second numerical value;
generating, at the bit stream generator, bit combinations representing a first bit sequence and a second bit sequence that encode the first and second numerical values, respectively, based on a proportion of the data bits in the sequence that are high relative to the total data bits in the sequence, wherein a subset of the bit combinations pairs a data bit of the first bit sequence with multiple different data bits of the second bit sequence, wherein generating the bit combinations comprises generating the first bit sequence using a first Sobol sequence source and generating the second bit sequence using a second Sobol sequence source different from the first Sobol sequence source; and producing, by computation logic, an output bit stream by performing a computational operation on the bit combinations, wherein the data bits of the output bit stream represent a result of the computational operation based on a probability that any data bit in the output bit stream is high.

22. The method of claim 21, further comprising:
directly driving, by a counter, the first Sobol sequence source to generate the first Sobol sequence; and
directly driving, by the counter, the second Sobol sequence source to generate the second Sobol sequence.

23. The method of claim 21, further comprising:
driving, by a first counter, the first Sobol sequence source to generate the first Sobol sequence;
driving, by a second counter, the second Sobol sequence source to generate the second Sobol sequence; and
stalling the second counter based on an output of the first counter.

24. A stochastic computational unit comprising:
a bit-stream generator configured to generate bit combinations representing a first bit sequence and a second bit sequence that encode first and second numerical values, respectively, based on a proportion of the data bits in the sequence that are high relative to the total data bits in the sequence, wherein a subset of the bit combinations pairs a data bit of the first bit sequence with multiple different data bits of the second bit sequence, wherein the first bit sequence is generated using a first Sobol sequence source, wherein the second bit sequence is generated using a second Sobol sequence source different from the first Sobol sequence source, and stochastic processing circuitry configured to:
perform a computational operation on the bit combinations; and
produce an output bit-stream having a set of data bits indicating a result of the computational operation, wherein the data bits of the output bit-stream represent the result based on a probability that any data bit in the set of data bits of the output bit-stream is high.

25. The stochastic computational unit of claim 24, further comprising a counter, wherein the first Sobol sequence source and the second Sobol sequence source are directly driven by the counter.

26. The stochastic computational unit of claim 24, further comprising a first counter and a second counter,
wherein the first Sobol sequence source is driven by a first counter, and
wherein the second Sobol sequence source is driven by a second counter configured to stall based on an output of the first counter.

27. The stochastic computational unit of claim 24, further comprising a counter configured to generate two or more count values in parallel,
wherein the first Sobol sequence source is configured to generate the first Sobol sequence by generating a first set of Sobol numbers in parallel based on the two or more count values generated by the counter.

* * * * *